(12) United States Patent
Chang et al.

(10) Patent No.: US 11,218,122 B2
(45) Date of Patent: Jan. 4, 2022

(54) SUPPLY MODULATOR, POWER AMPLIFIER HAVING THE SAME, METHOD FOR CONTROLLING THE SAME, AND METHOD FOR CONTROLLING THE POWER AMPLIFIER

(71) Applicant: Nanyang Technological University, Singapore (SG)

(72) Inventors: Joseph Sylvester Chang, Singapore (SG); Tong Ge, Singapore (SG); Huiqiao He, Singapore (SG); Linfei Guo, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 16/972,909

(22) PCT Filed: Jun. 6, 2019

(86) PCT No.: PCT/SG2019/050289
§ 371 (c)(1),
(2) Date: Dec. 7, 2020

(87) PCT Pub. No.: WO2019/236009
PCT Pub. Date: Dec. 12, 2019

(65) Prior Publication Data
US 2021/0250002 A1    Aug. 12, 2021

(30) Foreign Application Priority Data

Jun. 7, 2018 (SG) .......................... 10201804846Y

(51) Int. Cl.
*H03G 3/20* (2006.01)
*H03F 3/217* (2006.01)
(Continued)

(52) U.S. Cl.
CPC ......... *H03F 3/2171* (2013.01); *H03F 1/0227* (2013.01); *H03F 3/193* (2013.01);
(Continued)

(58) Field of Classification Search
CPC ...... H03F 1/0227; H03F 1/0238; H03F 1/025; H03F 1/0255
(Continued)

(56) References Cited

U.S. PATENT DOCUMENTS 9,813,088 B2 * 11/2017 Heo .......................... H03F 3/19
2011/0273235 A1    11/2011 Chen et al.
(Continued)

OTHER PUBLICATIONS

T. Jiang and Y. Wu, "An overview: peak-to-average power ratio reduction techniques for OFDM signals," IEEE Trans. on Broadcasting, vol. 54, No. 2, pp. 257-268, Jun. 2008.
(Continued)

*Primary Examiner* — Steven J Mottola
(74) *Attorney, Agent, or Firm* — Womble Bond Dickinson (US) LLP

(57) ABSTRACT

A supply modulator is provided, having a first amplifier circuit configured to generate a first electrical signal, a second amplifier circuit configured to generate a second electrical signal, the first and second electrical signals being for driving an electrical load, and a control circuit electrically coupled to the first and second amplifier circuits wherein the control circuit is configured to generate a pulsed electrical signal and to supply an output control signal to the second amplifier circuit for controlling generation of the second electrical output signal, wherein the supply modulator is configured to operate in two modes of operation, for the first amplifier circuit to generate the first electrical signals in response to quiescent current of the first amplifier circuit, for the control circuit to generate a modulated
(Continued)

electrical signal in accordance with a clock signal in one mode, and, for the second amplifier circuit to operate.

20 Claims, 17 Drawing Sheets

(51) Int. Cl.
    *H03F 1/02* (2006.01)
    *H03F 3/193* (2006.01)
(52) U.S. Cl.
    CPC .. *H03F 2200/102* (2013.01); *H03F 2200/432* (2013.01); *H03F 2200/451* (2013.01)
(58) Field of Classification Search
    USPC .................................................. 330/127, 136
    See application file for complete search history.

(56) References Cited

U.S. PATENT DOCUMENTS

| | | | |
|---|---|---|---|
| 2012/0326783 A1* | 12/2012 | Mathe | H03F 1/0227 330/251 |
| 2015/0236652 A1 | 8/2015 | Yang et al. | |
| 2019/0140597 A1* | 5/2019 | Lin | H02M 3/33569 |

OTHER PUBLICATIONS

H. Qian, Q. Liu, J. Silva-Martinez, and S. Hoyos, "A 35 dBm output power and 38 dB linear gain PA with 44.9% peak PAE at 1.9 GHz in 40 nm CMOS," IEEE J. Solid-State Circuits, vol. 51, No. 3, pp. 587-597, Mar. 2016.
T. W. Kwak, M. C. Lee, and G. H. Cho, "A 2W CMOS hybrid switching amplitude modulator for EDGE polar transmitters," IEEE J. of Solid-State Circuits, vol. 42, No. 12, pp. 2666-2676, Dec. 2007.
R. Shrestha, R. A. R. van der Zee, A. J. M. Graauw, and B. Nauta, "A wideband supply modulator for 20 MHz RF bandwidth polar PAs in 65nm CMOS," IEEE J. of Solid-State Circuits, vol. 44, No. 4, pp. 1272-1280, Apr. 2009.
P. Y. Wu and P. K. T. Mok, "A two-phase switching hybrid supply modulator for RF power amplifiers with 9% efficiency improvement," IEEE J. of Solid-State Circuits, vol. 45, No. 12, pp. 2543-2556, Dec. 2010.
M. Tan and W. H. Ki, "An efficiency-enhanced hybrid supply modulator with single-capacitor current-integration control," IEEE J. of Solid-State Circuits, vol. 51, No. 2, pp. 533-542, Feb. 2016.
M. Tan and W. H. Ki, "A 100 MHz hybrid supply modulator with ripple-current-based PWM control," IEEE J. of Solid-State Circuits, vol. 52, No. 2, pp. 569-578, Feb. 2017.
W. Y. Chu, B. Bakkaloglu, and S. Kiaei, "A 10MHz bandwidth 2mV ripple PA regulator for CDMA transmitters," IEEE J. of Solid-State Circuits, vol. 43, No. 12, pp. 2809-2819, Dec. 2008.
M. Hassan, L.E. Larson, V.W. Leung, and P. M. Asbeck, "A combined series-parallel hybrid envelope amplifier for envelope tracking mobile terminal RF power amplifier applications," IEEE J. Solid-State Circuits, vol. 47, No. 5, pp. 1185-1198, May 2012.
H. Xi, Q. Jin, X. Ruan, and X. Xiong, "Full Feedforward of the Output Voltage to Improve Efficiency for Envelope-Tracking Power Supply using Switch-Linear Hybrid Configuration," IEEE Trans, on Power Electronics, vol. 28, pp. 451-456, 2013.
R. Wu, Y, Liu, J. Lopez, C. Schecht, Y. Li, and D. Y. Lie, "High-efficiency silicon-based envelope-tracking power amplifier design with envelope shaping for broadband wireless applications," IEEE J. of Solid-State Circuits, vol. 48, No. 9, pp. 2030-2040, Sep. 2013.
J. S. Paek et al., "A—137 dBm/Hz noise, 82% efficiency AC-coupled hybrid supply modulator with integrated buckboost converter," IEEE J. of Solid-State Circuits, vol. 51, No. 11, pp. 2757-2768, Nov. 2016.

J. S. Paek et al., "An RF-PA Supply Modulator Achieving 83% Efficiency and -136dBm/Hz Noise for LTE-40MHz and GSM 35dBm Applications," in IEEE ISSCC Dig. Tech. Papers, 2016, pp. 354-355.
M. Vasić et al., "Envelope Amplifier based on Switching Capacitors for High-Efficiency RF Amplifiers," IEEE Trans, on Power Electronics, vol. 27, pp. 1359-1368, 2012.
P. Arno, M. Thomas, V. Molata, and T. Jerabek, "Envelope Modulator for Multimode Transmitters with AC-Coupled Multilevel Regulators," in IEEE ISSCC Dig. Tech. Papers, 2014, pp. 296-297.
F. Wang, D. F. Kimball, D. Y. Lie, P. M. Asbeck, and L. E. Larson, "A Monolithic High-Efficiency 2.4-GHz 20-dBm SiGe BiCMOS Envelope-Tracking OFDM Power Amplifier," IEEE Journal of Solid-State Circuits, vol. 42, pp. 1271-1281, 2007.
B. Kim et al., "Push the Envelope: Design Concepts for Envelope-Tracking Power Amplifiers," IEEE Microwave Magazine, vol. 14, pp. 68-81, 2013.
P. Asbeck, and Z. Popovic, "ET Comes of Age: Envelope Tracking for Higher-Efficiency Power Amplifiers," IEEE Microwave Magazine, 2016.
V. Yousefzadeh, N. Wang, Z. Popovic, and D. Maksimovic, "A Digitally Controlled DC/DC Converter for An RF Power Amplifier," IEEE Trans, on Power Electronics, vol. 21, pp. 164-172, 2006.
O. Garcia, M. Vasić, P. Alou, J. A. Oliver, and J. A. Cobos, "An Overview of Fast DC-DC Converters for Envelope Amplifier in RF Transmitters," IEEE Trans. on Power Electronics, vol. 28, pp. 4712-4722, 2013.
S. Sung et al., "Envelope Modulator for 1.6-W 10-MHz LTE PA without AC Coupling Capacitor Achieving 86.5% Peak Efficiency," IEEE Trans, on Power Electronics, vol. 31, pp. 8282-8292, 2016.
J. Sankman, M. K. Song, and D. Ma, "Switching-Converter-Only Multiphase Envelope Modulator with Stew Rate Enhancer for LTE Power Amplifier Applications," IEEE Trans, on Power Electronics, vol. 31, pp. 817-826, 2016.
V. Yousefeadeh, E. Alarcon, and D. Maksimovic, "Three-Level Buck Converter for Envelope Tracking Application," IEEE Trans. on Power Electronics, vol. 21, pp. 549-552, 2006.
M. Bathily, B. Allard, F. Hasbani, V. Pinon, and J. Verdier, "Design Flow for High Switching Frequency and Large-Bandwidth Analog DC/DC Step-Down Converters for A Polar Transmitter," IEEE Trans, on Power Electronics, vol. 27, pp. 838-847, 2012.
V. Pinon, F. Hasbani, A. Giry, D. Pache, and C. Gamier, "A Single-Chip WCDMA Envelope Reconstruction LDMOS PA with 130MHz Switched-Mode Power Supply," in ISSCC Dig. Tech. Papers, 2008, pp. 564-636.
P. Reynaert, and M. S. J. Steyaert, "A 1.75-GHz Polar Modulated CMOS RF Power Amplifier for GSM-EDGE," IEEE Journal of Solid-State Circuits, vol. 40, pp. 2598-2608, 2005.
F. Wang et al., "An Improved Power-Added Efficiency 19-dBm Hybrid Envelope Elimination and Restoration Power Amplifier for 802.11g WLAN Applications," IEEE Transactions on Microwave Theory and Techniques 54.12 (2006). pp 4086-4099.
L. Guo, T. Ge, and J. S. Chang, "A 101 dB PSRR 0.0027% THD+N and 94% power-efficiency filterless class D amplifier," IEEE J. Solid-State Circuits, vol. 49, No. 11, pp. 2608-2617, Nov. 2014.
J. S. Chang, M. T. Tan, Z. Cheng, and Y. Tong, "Analysis and design of power efficient class D amplifier output stages," IEEE Trans. Circuits Syst, I: Fund. Theory Applicat., vol. 47, No. 6, pp. 897-902, Jun. 2000.
T. Ge and J. S. Chang, "Bang-bang control Class D amplifiers: total harmonic distortion and supply noise," IEEE Trans. Circuits Syst. I: Reg. Papers, vol. 56, No. 10, pp. 2353-2361, Oct. 2009.
Choi J. et al., "A Polar Transmitter With CMOS Programmable Hysteretic-Controlled Hybrid Switching Supply Modulator For Multistandard Applications", IEEE Transactions on Microwave Theory and Techniques, May 27, 2009, vol. 57, No. 7, p. 1675-1686.
He H. et al., "A 2.5-W 40-Mhz-Bandwidth Hybrid Supply Modulator With 91% Peak Efficiency, 3-V Output Swing, and 4-mV Output Ripple at 2.6-V Supply", IEEE Transactions on Power Electronics, Apr. 15, 2018, vol. 34, No. 1, pp. 712-723.

* cited by examiner

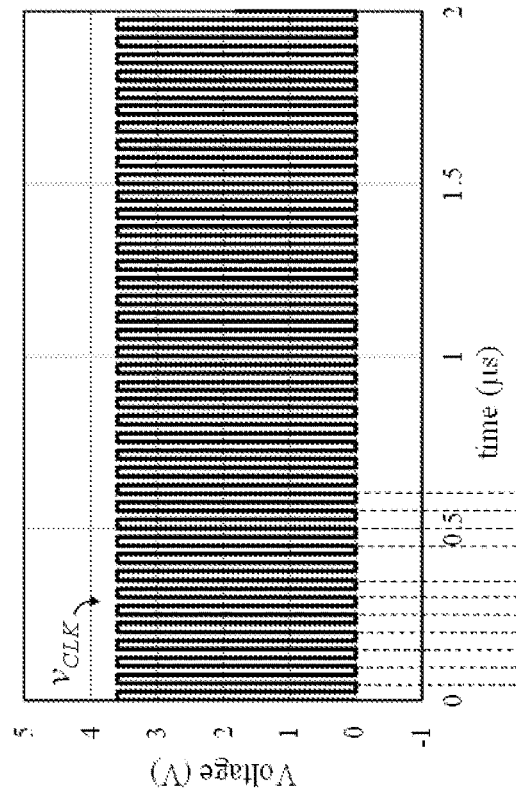
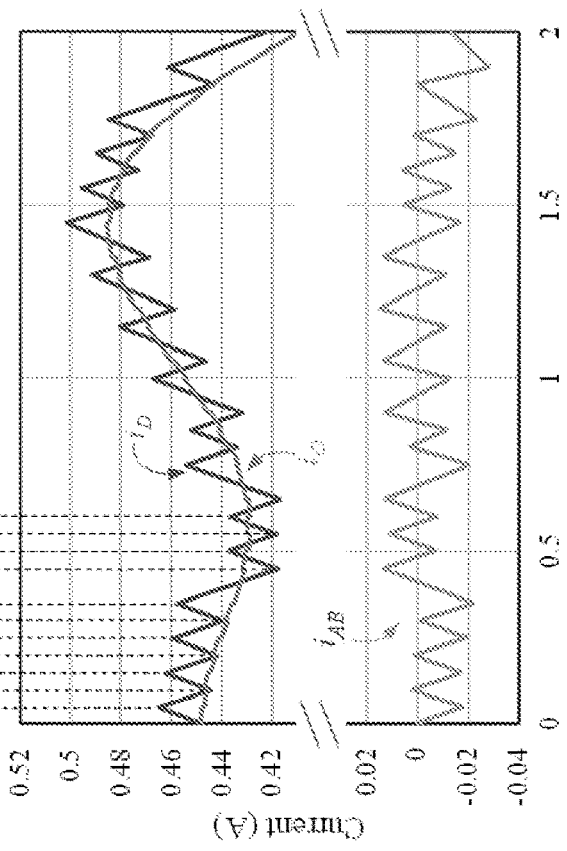
FIG. 7C
FIG. 7D
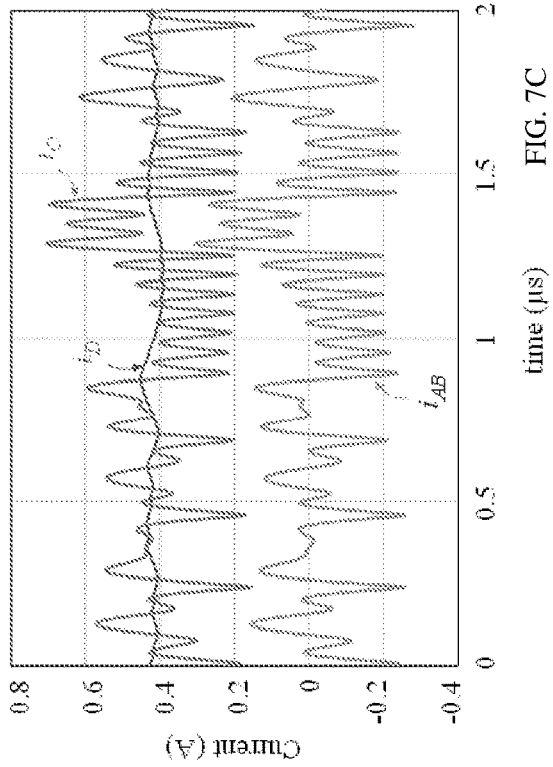
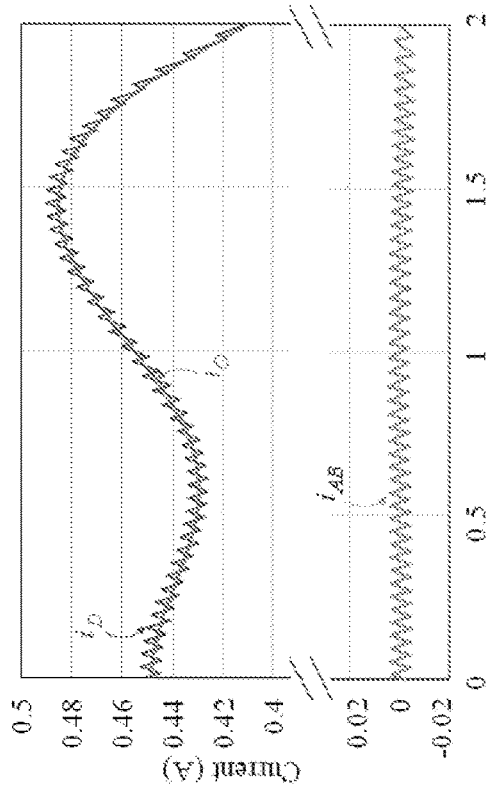
FIG. 7E

| $V_{ENV\_DC}$ | BC_EN | SW1 | SW2 | SW3 | SW4 | $I_B$ | $I_Q$ |
|---|---|---|---|---|---|---|---|
| X | 1 | ON | ON | ON | ON | 500μA | 8.2mA |
| $<V_{ref1}$ | 0 | ON | ON | ON | ON | 500μA | 8.2mA |
| $>V_{ref1}$ and $<V_{ref2}$ | 0 | OFF | ON | ON | ON | 400μA | 10.5mA |
| $>V_{ref2}$ and $<V_{ref3}$ | 0 | OFF | OFF | ON | ON | 300μA | 14.0mA |
| $>V_{ref3}$ and $<V_{ref4}$ | 0 | OFF | OFF | OFF | ON | 200μA | 19.3mA |
| $>V_{ref4}$ | 0 | OFF | OFF | OFF | OFF | 100μA | 28.2mA |

SUPPLY MODULATOR, POWER AMPLIFIER HAVING THE SAME, METHOD FOR CONTROLLING THE SAME, AND METHOD FOR CONTROLLING THE POWER AMPLIFIER

CROSS-REFERENCE TO RELATED APPLICATIONS

This application is a national stage filing under 35 U.S.C. § 371 of PCT/SG2019/050289, filed Jun. 6, 2019, which International Application was published by the International Bureau in English on Dec. 12, 2019, as WO 2019/236009, which claims the benefit of priority of Singapore patent application No. 10201804846Y, filed Jun. 7, 2018, which applications are hereby incorporated by reference in their entirety in this application.

TECHNICAL FIELD

Various embodiments relate to a supply modulator, a power amplifier having the supply modulator, a method for controlling the supply modulator, and a method for controlling the power amplifier.

BACKGROUND

Short battery lifespan is one of the challenges of mobile communication devices and is exacerbated with the demand for ever-increasing speed and data. This is in part due to the adopted communication protocols, e.g., LTE (Long-Term Evolution) and LTE-A (LTE Advanced), that employ spectrally efficient modulation schemes such as 16 or higher Quadrature Amplitude Modulation. These modulation schemes impose stringent requirements on the linearity of the Radio Frequency (RF) Power Amplifier (PA), yet requiring high Peak-to-Average-Power-Ratio-translating to low power-efficiency in known RF PAs, hence reduced battery-life.

Of the various known methods to improve the power-efficiency of RF PAs, the Envelope Tracking (ET), comprising a supply modulator and RF PA(s), as depicted in FIG. 1A, has been reported to be one of the most effective means. This is because ET PAs generally feature higher power-efficiency, yet with relatively wide signal bandwidth and good linearity. FIG. 1A shows a block diagram of a prior art ET PA (Envelope Tracking Power Amplifier) 180 having a hybrid supply modulator 181 and a RF PA (Radio Frequency Power Amplifier) 182. The hybrid supply modulator 181 includes a linear Class AB amplifier 183, a high-efficiency Class D amplifier 184 and a controller 185 which controls the switching of the Class D amplifier 184.

Hybrid supply modulators (e.g., 181; FIG. 1A), comprising a high-efficiency Class D amplifier and a wide-bandwidth Class AB amplifier, is commonly employed for ET PAs (see Table 2 later). The supply modulator provides a variable voltage supply, $v_{DD\_PA}$, to the linear RF PA based on the RF output, $RF_{out}$; in the case of known RF PAs, the supply is a constant voltage. Consequently, as desired, the RF PA in the ET PA would nearly always operate in compression, hence featuring higher power-efficiency compared to known RF PAs. The operational modality of an ET PA and a known RF PA is depicted in FIG. 1B, where the power-efficiency of the ET PA is typically ~20% higher.

Despite the power-efficiency advantage of ET PAs, one limitation of known supply modulators is that they are optimised for a single communications standard, e.g., LTE, or the optimisation is compromised when designed for multiple standards. Put simply, as modern communication devices, including smartphones and tablets, usually embody multiple communication standards where each standard requires different bandwidth, peak-to-average power ratio (PAPR), output power, etc. (see Table 1 further below), known supply modulators are often unoptimised or semi-optimised. For example, FIG. 2 depicts the block diagram of a known RF system 280 having a supply modulator 281. Of specific interest, although multiple RF PAs 282 are included in the RF system 280 to support multiple communication standards, only one supply modulator 281 is used. This is largely because of the limited form-factor (IC area) and the high cost.

Other limitations in known supply modulators include narrow (and insufficient) bandwidth, low (and insufficient) output power, low power-efficiency, and/or high switching noise (see Table 2 further below). Specifically, the major shortcoming of known supply modulators is their limited bandwidth of ≤20 MHz, which is insufficient for LTE-A applications whose bandwidth is 40 MHz-100 MHz. Known designs also have low output power of <0.2 W. This low output power is, however, generally unacceptable for the recent communication protocols including LTE and LTE-A. The typical output power of a LTE/LTE-A RF PA is ~27 dBm (0.5 W) taking into account the duplexer and antenna losses. Hence, the output power of the supply modulator would need to be >1 W for the III/V-based RF PA (with ~45% power-efficiency) and >2 W for CMOS-based RF PA (with ~25% power-efficiency). The aforesaid limitations are in part due to the inevitable trade-offs between the parameters of the supply modulator. For instance, narrow bandwidth and low switching noise usually require high switching frequency which in turn leads to high switching loss, hence reducing the power-efficiency of the supply modulator.

There is therefore need for a supply modulator that addresses one or more of the above-mentioned issues of the prior art.

SUMMARY

The invention is defined in the independent claims. Further embodiments of the invention are defined in the dependent claims.

According to an embodiment, a supply modulator is provided. The supply modulator may include a first amplifier circuit configured to generate a first electrical output signal for driving an electrical load, a control circuit electrically coupled to the first amplifier circuit, and a second amplifier circuit electrically coupled to the control circuit, the second amplifier circuit being configured to generate a second electrical output signal for driving the electrical load, wherein the control circuit is configured to generate a pulsed electrical signal based on the first electrical output signal, and further configured to supply, based on the pulsed electrical signal, an output control signal to the second amplifier circuit for controlling generation of the second electrical output signal, wherein, the supply modulator is configured, in a first mode of operation, for the first amplifier circuit to generate the first electrical output signal in response to a quiescent current of the first amplifier circuit being of a first magnitude that is fixed, for the control circuit to sample the pulsed electrical signal in accordance with a clock signal received by the control circuit to generate a modulated electrical signal as the output control signal, and for the second amplifier circuit, for generating the second electrical output signal, to operate at a first frequency in accordance with a temporal-related parameter of the modulated electrical signal, and, in a second mode of operation, for the first amplifier circuit to generate the first electrical output signal in response to the quiescent current being of a second magnitude that is variable, for the control circuit to provide the pulsed electrical signal as the output control signal, and for the second amplifier circuit, for generating the second electrical output signal, to operate at a second frequency in accordance with a temporal-related parameter of the pulsed electrical signal.

According to an embodiment, a power amplifier is provided. The power amplifier may include the supply modulator as described herein, and an electrical load electrically coupled to the supply modulator, wherein the supply modulator is configured to receive an input signal, and further configured to track an envelope of the input signal for generating the first electrical output signal and the second electrical output signal for driving the electrical load.

According to an embodiment, a method for controlling a supply modulator is provided. The method may include generating, by means of a first amplifier circuit of the supply modulator, a first electrical output signal for driving an electrical load, generating, by means of a control circuit of the supply modulator, a pulsed electrical signal based on the first electrical output signal, generating, by means of a second amplifier circuit of the supply modulator, a second electrical output signal for driving the electrical load, and supplying, based on the pulsed electrical signal and by means of the control circuit, an output control signal for controlling generation of the second electrical output signal, wherein, in a first mode of operation, the method includes generating the first electrical output signal in response to a quiescent current of the first amplifier circuit being of a first magnitude that is fixed, sampling, by means of the control circuit, the pulsed electrical signal in accordance with a clock signal to generate a modulated electrical signal as the output control signal, and operating the second amplifier circuit at a first frequency in accordance with a temporal-related parameter of the modulated electrical signal for generating the second electrical output signal, wherein, in a second mode of operation, the method includes generating the first electrical output signal in response to the quiescent current being of a second magnitude that is variable, providing, by means of the control circuit, the pulsed electrical signal as the output control signal, and operating the second amplifier circuit at a second frequency in accordance with a temporal-related parameter of the pulsed electrical signal for generating the second electrical output signal.

According to an embodiment, a method for controlling a power amplifier is provided. The method may include receiving, by means of a supply modulator of the power amplifier, an input signal, wherein the supply modulator is as described herein, and tracking an envelope of the input signal for generating the first electrical output signal and the second electrical output signal for driving an electrical load of the power amplifier.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 1A shows a block diagram of a prior art ET PA (Envelope Tracking Power Amplifier) having a hybrid supply modulator and a RF PA (Radio Frequency Power Amplifier), while

FIG. 3A shows a plot of switching frequency and power-efficiency for various input frequencies, while

FIGS. 7C, 7D and 7E show respectively plots of the current waveforms of the supply modulator tracking 20 MHz LTE envelope signal with asynchronous Sigma-Delta control, 1.4 MHz LTE envelope signals with synchronous Sigma-Delta control ($f_{CLK}$=20 MHz), and, 1.4 MHz LTE envelope signals with asynchronous Sigma-Delta control.

FIG. 8A shows a schematic diagram of the bias current control block of FIG. 6, while FIG. 8B illustrates the corresponding operations.

FIG. 9B shows a plot of simulated results of the maximum output current ($I_{max}$) and the gain-bandwidth product (GBW) with various $I_Q$, while

DETAILED DESCRIPTION

Figure 1A:
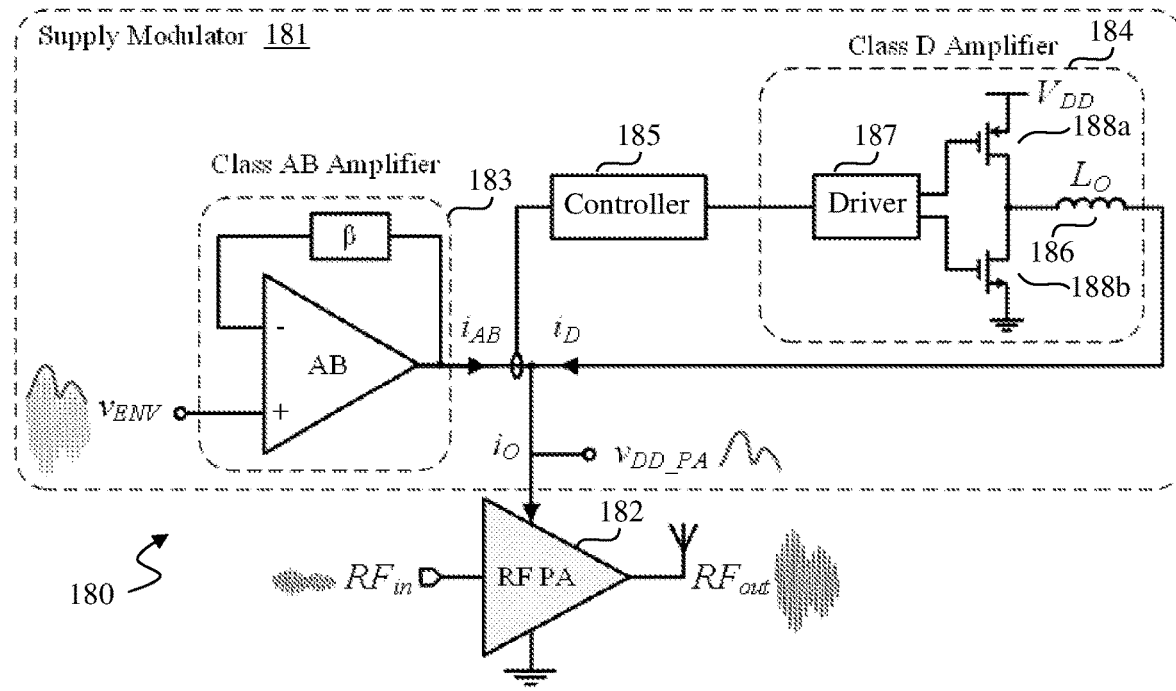
Figure 1B:
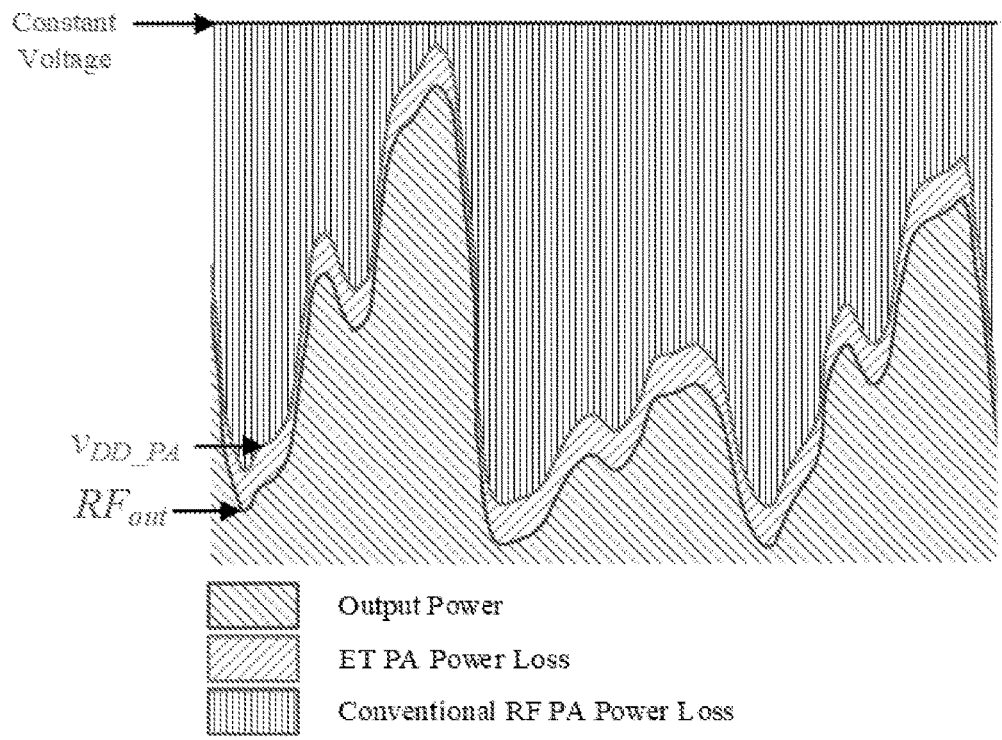
FIG. 1B shows a plot illustrating comparison of power dissipation in ET PA and RF PA of prior art.
Figure 2:
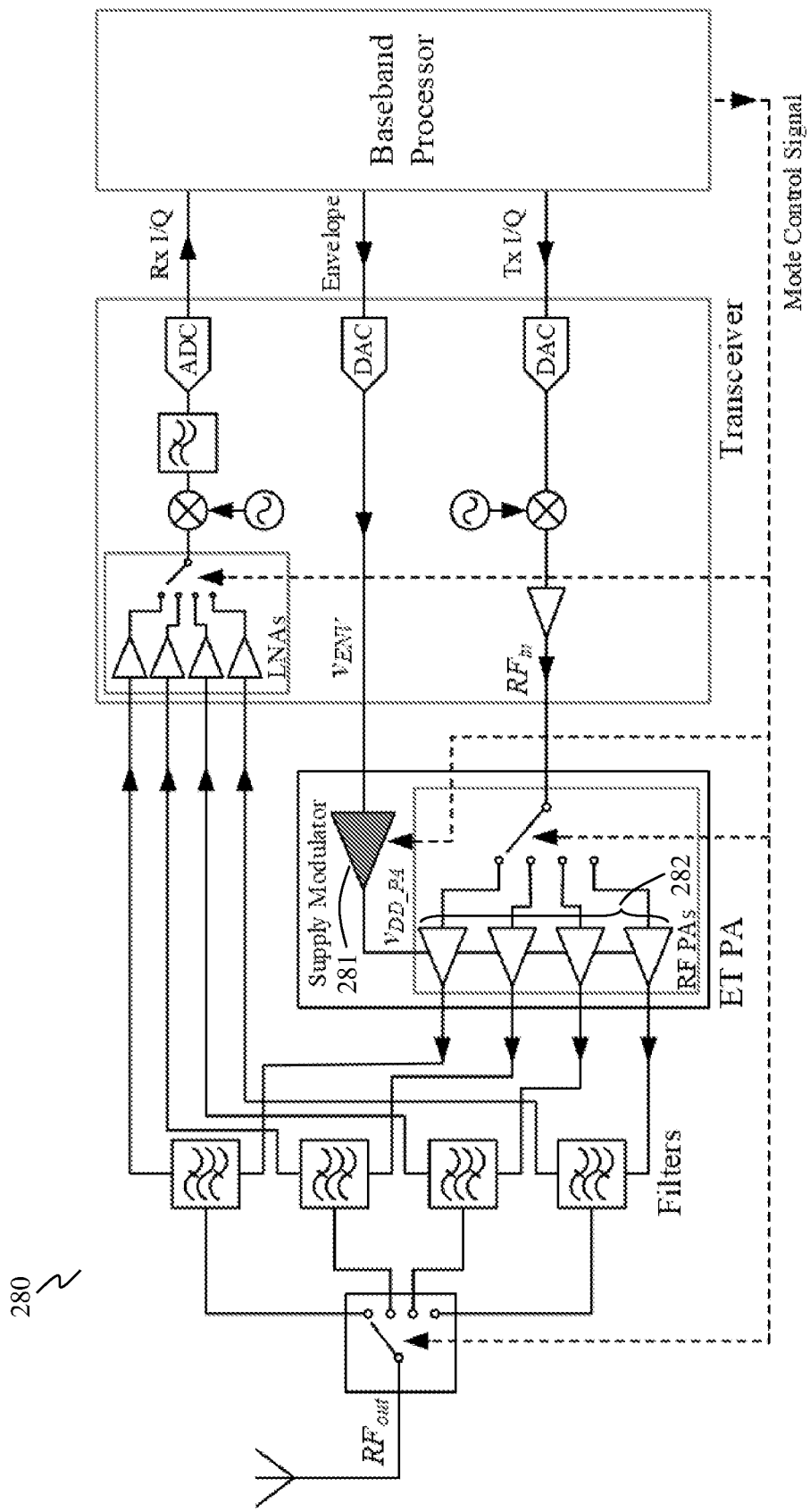
FIG. 2 shows a block diagram of a prior art RF (Radio Frequency) system with an ET PA (Envelope Tracking Power Amplifier).

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

The operation of a known supply modulator is first discussed, followed by the design challenges towards the supply modulator for multi-standard applications. Discussion is provided using the supply modulator 181 of FIG. 1A as an example of a known supply modulator. According to input signal and the amount of current provided by the Class D amplifier 184 and the Class AB amplifier 183, the operation of the supply modulator 181 can be divided into two cases, which will now be described in detail.

Case 1: Low Input Frequency (Narrowband Application)

In this case, the average slew rate, $SRi_O$, of the output signal, $v_{DD\_PA}$, is less than the slew rate, $SRi_D$, of the Class D amplifier 184 (i.e., $SRi_O < SRi_D$), such that the Class D amplifier 184 is able to track the output signal closely. Further, the switching frequency of the Class D amplifier 184, $f_{sw(nb)}$, is much higher than the input frequency, $f_{in}$, which is the frequency of the input signal, $v_{ENV}$. Hence, the Class D amplifier 184 provides the majority of the current (including DC and AC components) to the RF PA 182, and the Class AB amplifier 183 provides only the ripple current (to cancel the ripple due to the switching of the Class D amplifier 184). In this case, $f_{sw(nb)}$ is controlled by the controller 185 and the ripple current in the Class D amplifier 184. Specifically, the controller 185 senses the ripple current in the Class D amplifier 184, and when the ripple current is larger than a pre-determined value (i.e., the hysteresis of the hysteresis controller 185, the output of the controller 185 changes from digital '0' to digital '1' or vice versa. The analytical expression of the switching frequency can be expressed as:

$$f_{sw(nb)} = \frac{V_{DD}}{4 I_{HYS} L_O} \left[ 1 - \left( \frac{L_O * SRi_O + v_{DD\_PA} - \frac{1}{2} V_{DD}}{\frac{1}{2} V_{DD}} \right)^2 \right], \quad \text{Equation (1)}$$

where $V_{DD}$ is the supply voltage, $v_{DD\_PA}$ is the variable voltage supply provided by the supply modulator 181, $I_{HYS}$ is the hysteresis current of the supply modulator 181, and $L_O$ is the output inductor 186 in FIG. 1A.

Figure 3A:
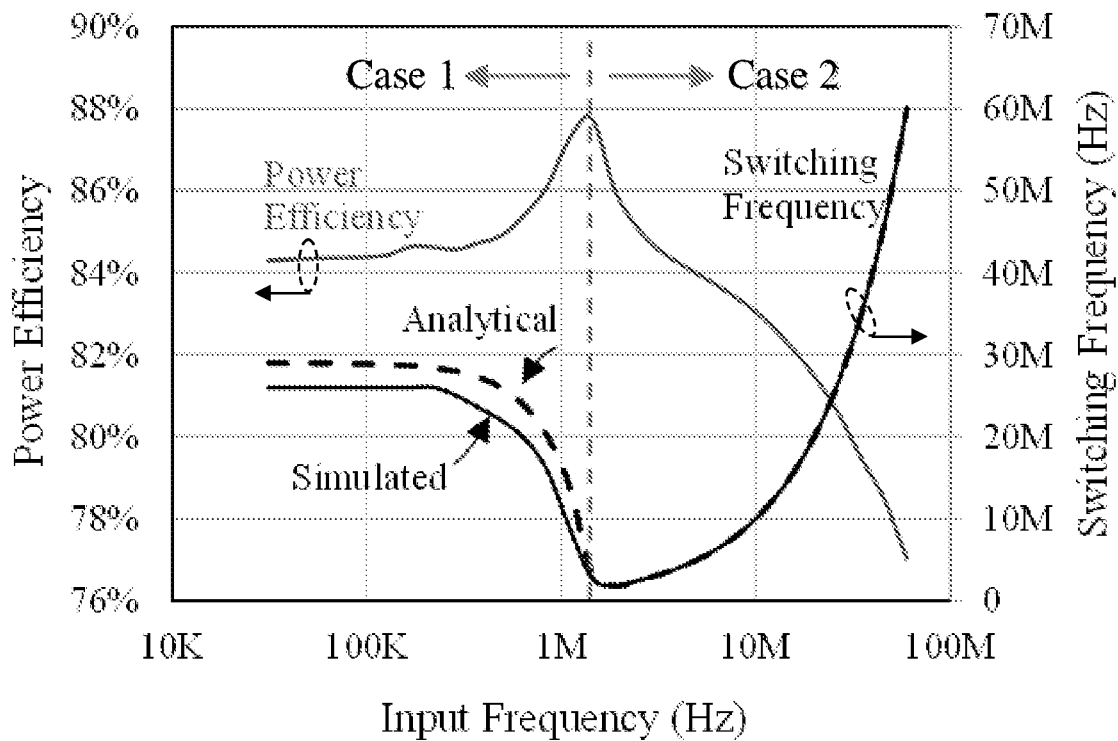

FIG. 3A shows the average switching frequency and power-efficiency for various input frequencies $f_{in}$ (with $1.8V_{DC}$ and $0.5V_{pp}$). For completeness, the switching frequency and the power-efficiency for Case 2 to be described further below are also shown in FIG. 3A. It can be seen that the switching frequency based on Equation (1) is similar to that obtained from simulations. From Equation (1), it can be observed that the switching frequency, $f_{sw(nb)}$, is affected by both the design parameters of the supply modulator 181 (in this case, $I_{HYS}$=6 mA, $V_{DD}$=3.6V, and $L_O$=4.7 µH), and the slew rate of the signal, $SRi_O$. When $SRi_O$ is low, the switching frequency is nearly constant, and reduces when $SRi_O$ increases. When $SRi_O$ increases further, the Class D amplifier 184 is unable to track the output signal, and this leads to Case 2 of the Class D amplifier 184 (i.e., $SRi_O > SRi_D$); see further below.

The optimum switching frequency, $f_{sw\_op(nb)}$, for maximum power-efficiency may be as defined by Equation (2) below.

$$f_{sw\_op(nb)} = \sqrt{\frac{1 - \left( \frac{L_O * SRi_o + v_{DD\_PA} - \frac{1}{2} V_{DD}}{\frac{1}{2} V_{DD}} \right)^2}{16 \, C_{eq} L_O}}, \quad \text{Equation (2)}$$

where $C_{eq}$ is the parasitic capacitance of the drivers 187 and power transistors 188a, 188b in the Class D amplifier 184.

Equation (2) may be derived as follows. The power dissipation, $P_{loss}$, of the supply modulator 181 in Case 1 can be separated into two parts—power loss, $P_{loss\_D}$, from the Class D amplifier 184, and power loss, $P_{loss\_AB}$, from the Class AB amplifier 183. $P_{loss\_D}$, expressed in Equation (3), includes the switching loss and conduction loss, due to the parasitic capacitance ($C_{eq}$) and the parasitic resistance ($R_{eq}$) of the drivers 187 and power transistors 188a, 188b. $P_{loss\_AB}$, expressed in Equation (4), includes the quiescent power due to the quiescent current, $I_Q$, and the power loss due to the absorption of the ripple current in the Class D amplifier 184 ($i_{AB(pp)} = I_{HYS}$).

$$P_{loss\_D} = f_{sw(nb)} C_{eq} V_{DD}^2 + \frac{R_{eq}}{R_L} i_o v_{DD\_PA}, \quad \text{Equation (3)}$$

$$P_{loss\_AB} = I_Q V_{DD} + \frac{1}{4} I_{HYS} V_{DD}, \quad \text{Equation (4)}$$

where $R_L$ represents the RF load, and $i_O$ is the output current of the supply modulator 181, where $i_O = i_{AB} + i_D$.

By substituting Equation (1) into Equation (3), $P_{loss}$ may be derived as:

$$P_{loss} = f_{sw(nb)}C_{eq}V_{DD}^2 + \frac{R_{eq}}{R_L}i_o v_{DD\_PA} + I_Q V_{DD} +$$

$$\frac{V_{DD}^2}{16 \, L_O f_{sw(nb)}}\left[1 - \left(\frac{L_O * SRi_O + v_{DD\_PA} - \frac{1}{2}V_{DD}}{\frac{1}{2}V_{DD}}\right)^2\right].$$

Equation (5)

The optimum switching frequency, $f_{sw\_op(nb)}$ can be derived by taking the derivative of $P_{loss}$ of Equation (5) and equating it to zero (i.e., $\partial P_{loss}/\partial f_{sw(nb)}=0$), resulting in $f_{sw\_op(nb)}$ defined in Equation (2).

Figure 3B:
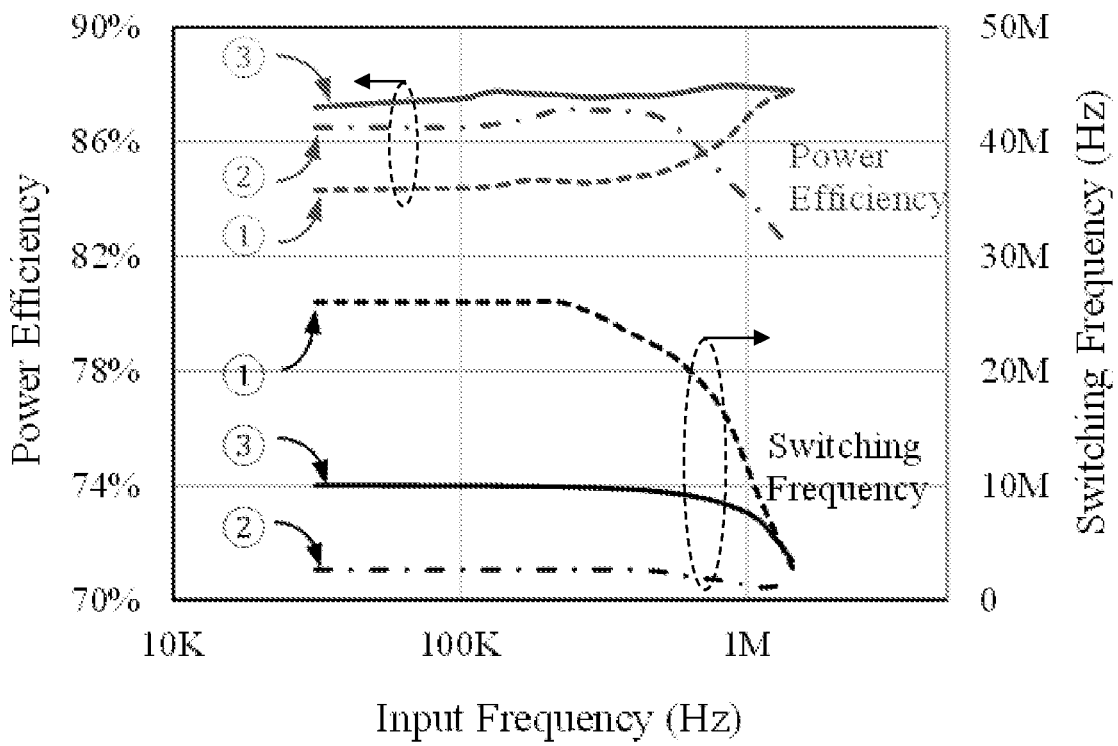
FIG. 3B shows a plot of simulated power-efficiency at three different switching frequencies.

To verify Equation (2), FIG. 3B depicts the simulated power-efficiency at three different switching frequencies. The switching frequencies for line ① and line ② are simulated with fixed $I_{HYS}$ ($I_{HYS}$=6 mA and 50 mA, respectively); and at low frequencies ($f_{in}$<500 kHz), the switching frequency is ~25 MHz for line ① and ~4 MHz for line ②. The line ③ is the optimum switching frequency derived from Equation (2), which is ~10 MHz at $f_{in}$<500 kHz and drops to ~4 MHz at $f_{in}$=1.5 MHz. As may also be observed in FIG. 3B, the power-efficiency associated with line ③ corresponding to the optimum switching frequency is the highest.

The power-efficiency is at its maximum when the switching frequency is designed at the optimum switching frequency—the power-efficiency is reduced when the switching frequency is below or above the optimum switching frequency. This is mainly due to the trade-off between the switching loss of the Class D amplifier 184 and the power dissipation in the Class AB amplifier 183. In other words, the power dissipation in the Class AB amplifier 183 increases with the decrease of the switching frequency (i.e., the decrease of the switching loss). This is because the output current of the Class AB amplifier 183, $i_{AB}$, is bounded by the hysteresis current, $I_{HYS}$, of the controller 185 (i.e., the peak-to-peak current $i_{AB(pp)}$ equals to $I_{HYS}$) to cancel the ripple current due to the switching of the Class D amplifier 184, and there is a trade-off between $I_{HYS}$ and $f_{sw(nb)}$ as expressed in Equation (1). Taking both power dissipation mechanisms into consideration, the maximum power-efficiency is achieved at $f_{sw\_op(nb)}$ expressed in Equation (2).

It can be seen from Equation (2) that the optimum switching frequency depends on the slew rate of the signal, $SRi_O$. In other words, the optimum switching frequencies for different communication standards are different. However, as known designs embody a fixed $I_{HYS}$, for instance line ① and line ② in FIG. 3B, optimised power-efficiency can only be achieved for a specific input signal and is hence un-optimised for other input signals.

Case 2: High Input Frequency (Wideband Application)

When the input frequency is high (i.e., for wideband applications), the slew rate of the output signal, $v_{DD\_PA}$, exceeds the slew rate of the Class D amplifier 184 (i.e., $SRi_O > SRi_D$). In this case, the DC component of the output signal is provided by the Class D amplifier 184 whilst the AC component is collectively provided by the Class D amplifier 184 and the Class AB amplifier 183—this is different from Case 1 earlier. The switching frequency, $f_{sw(wb)}$, of the Class D amplifier 184 only depends on the input signal, $v_{ENV}$, and it is independent of the hysteresis $I_{HYS}$. This can be analytically verified from FIG. 3A.

Figure 4:
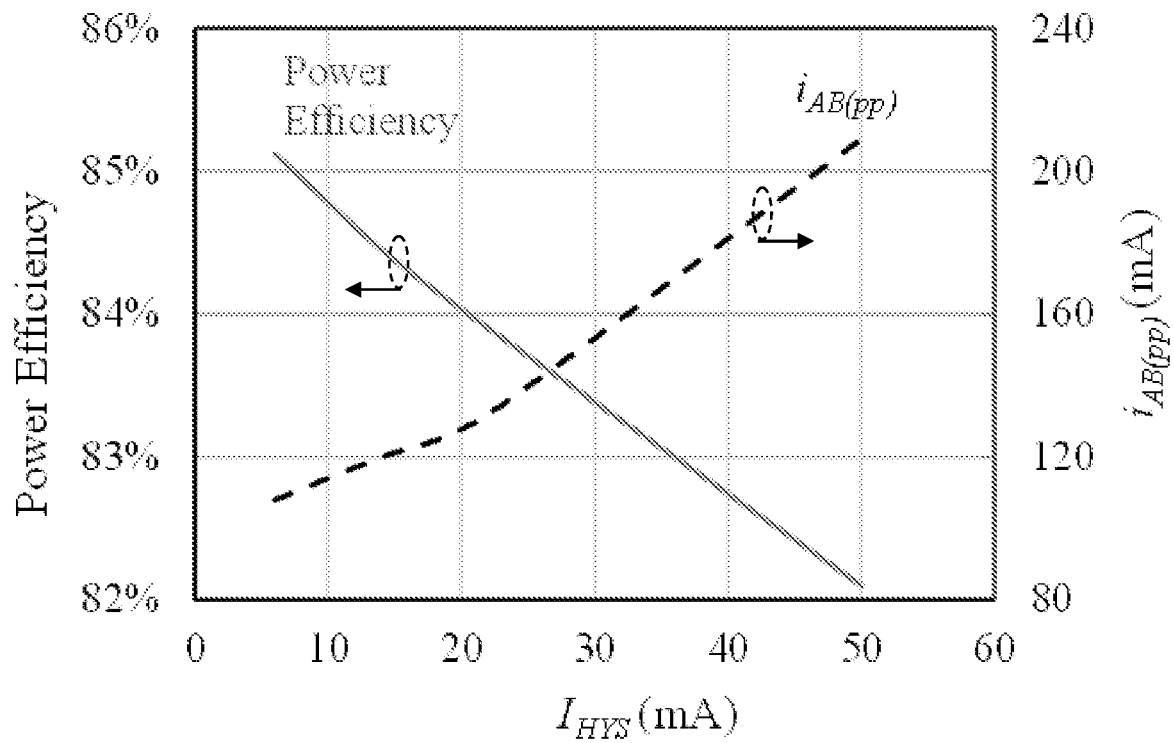
FIG. 4 shows a plot of power-efficiency and $i_{AB(pp)}$ for various hysteresis currents, $I_{HYS}$.

FIG. 4 illustrates the peak-to-peak current in the Class AB amplifier 183, $i_{AB(pp)}$, and the power-efficiency for various hysteresis currents, $I_{HYS}$. For FIG. 4, the input frequency is 2.5 MHz (with 1.8$V_{DC}$ and 0.5$V_{pp}$). It can be seen that when the hysteresis current $I_{HYS}$ increases, the current burden of the Class AB amplifier 183 increases and the power-efficiency of the supply modulator 181 is reduced. This is because, in this case, the hysteresis results in a phase lag (delay) in the Class D amplifier 184. The phase lag in the Class D amplifier 184 subsequently results in a current flow between the Class AB amplifier 183 and the Class D amplifier 184—this is to compensate for the distortion in the output signal, $v_{DD\_PA}$, due to the phase lag in the Class D amplifier 184. Consequently, the output current in the Class AB amplifier 183 increases, thereby decreasing the overall power-efficiency of the supply modulator 181. Put simply, to improve the power-efficiency, the hysteresis of the supply modulator 181 should be low in Case 2. The hysteresis current, $I_{HYS}$, is contributed by the threshold currents, $\pm I_T$, of the known hysteresis comparator 185 and the inherent delay of the supply modulator 181. In view of this, for wideband applications, $I_T=0$ is recommended and the inherent delay should be as small as possible.

As described, in known designs where the hysteresis, $I_{HYS}$, of the supply modulator is fixed, $I_{HYS}$ and $f_{sw(nb)}$ can only be optimised for single standard application. Undoubtedly, there are challenges to design a supply modulator optimised for multi-standard applications or operations.

For narrowband applications, the switching frequency should be designed at its optimum switching frequency (see Equation (2)) and it is application dependent. Conversely, for wideband applications, the hysteresis should be as small as possible—this somewhat contradicts the requirements for the narrowband applications as small hysteresis translates to high switching frequency in narrowband applications, resulting in high switching losses. As a case in point, with $I_{HYS}$=6 mA (the minimum hysteresis due to the inherent delay in the design of various embodiments (for example, see FIG. 6 and corresponding description further below)), the supply modulator achieves the highest power-efficiency for wideband applications (see FIG. 4). However, its power-efficiency would be compromised in narrowband applications due to its excessively high switching frequency (refer to line ① in FIG. 3B). Put simply, to achieve a high power-efficiency for multi-standard applications, the controller of the supply modulator should be designed differently for each application. This may be addressed by the designs and techniques disclosed herein for various embodiments.

Various embodiments may provide ultra-wide-bandwidth-cum-ultra-high-output-power supply modulators for multi-standard applications.

Various embodiments may provide a supply modulator for multi-standard applications.

Various embodiments may provide a supply modulator to address one or more aforementioned limitations of the prior art. The operation of the supply modulator may be self-adjusted such that the power-efficiency of the supply modulator may be optimised for multi-standard applications, yet with wide bandwidth, sufficient output power, and low switching noise.

The supply modulator of various embodiments may employ a hybrid supply modulator with a dual-mode Sigma-Delta control and an adaptive biasing Class AB amplifier to automatically adjust the operation mode of the supply modulator according to the communication standards. The dual-mode Sigma-Delta control enables two operation modes to improve the power-efficiency of the supply modulator—a synchronous Sigma-Delta mode for narrowband applications and an asynchronous Sigma-Delta mode for wideband applications. For narrowband applications (see Table 1 below), the supply modulator operates in the synchronous Sigma-Delta mode where the switching frequency of the Class D amplifier may be reduced and controlled by a clock signal—the aim is to reduce the switching loss when tracking narrowband envelope signals. Conversely, for wideband applications (see Table 1 below), the supply modulator operates in the asynchronous Sigma-Delta mode where the hysteresis of the controller may be minimised and controlled by the inherent propagation delay of the supply modulator—the purpose here is to reduce the power loss due to the phase lag of the Class D amplifier when tracking wideband envelope signals. The Class AB amplifier of various embodiments may adjust the bias current (hence the ensuing quiescent current) according to the applications to minimise the quiescent power dissipation of the Class AB amplifier. During narrowband applications, the required output current of the Class AB amplifier may be low and a fixed low quiescent current may be used. Conversely, during wideband applications where the output current of the Class AB amplifier may be high, a high and variable quiescent current may be used—the quiescent current increases when the output power increases and vice versa.

and/or the dual-mode Sigma-Delta control block may be formed integrally with the Class D amplifier.

For narrowband applications, the supply modulator may operate in a synchronous Sigma-Delta mode. The quiescent current of the Class AB amplifier may be at a fixed low value, and the switching frequency of the Class D amplifier may be reduced and controlled by a clock signal.

For wideband applications, the supply modulator may operate in an asynchronous Sigma-Delta mode. The quiescent current of the Class AB amplifier may be high and variable, and the switching frequency of the Class D amplifier may be adjustable/variable according to the digital signal.

Figure 5A:
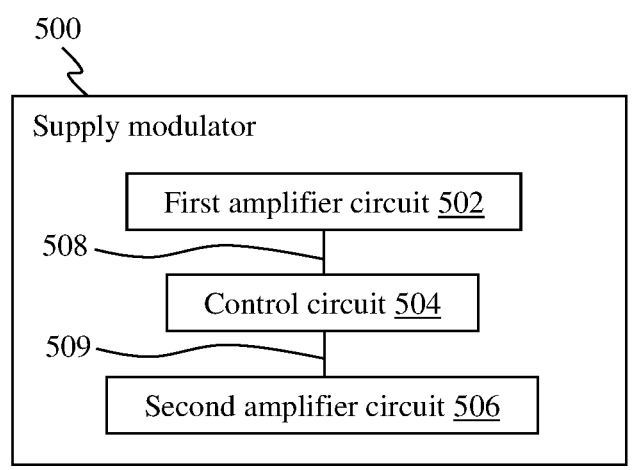
FIG. 5A shows a schematic block diagram of a supply modulator, according to various embodiments.

FIG. 5A shows a schematic block diagram of a supply modulator 500, according to various embodiments. The supply modulator 500 includes a first amplifier circuit 502 configured to generate a first electrical output signal for driving an electrical load, a control circuit 504 electrically coupled (as represented by the line 508) to the first amplifier circuit 502, and a second amplifier circuit 506 electrically coupled (as represented by the line 509) to the control circuit

TABLE 1

Operation for various wireless mobile telecommunication standards

| | Standards | BW (Hz) | Uplink Modulation | PAPR (dB) | Max Output Power* (dBm) | Mode Control Signal | | | Control Mode | $I_Q$ (mA) |
|---|---|---|---|---|---|---|---|---|---|---|
| | | | | | | CLK_EN | $f_{CLK}$ (Hz) | BC_EN | | |
| Narrow-band | GSM EDGE | 384k | 8-PSK | 3.2 | 22 | 0 | 20M | 1 | Syn. Sigma-Delta | 8.2 |
| | CDMA 2000-1X | 1.25M | BPSK/ QPSK/ 8-PSK | 3.5-7 | 30 | 0 | 20M | 1 | | |
| | LTE | 1.4M | QPSK/ 16QAM/ 64QAM | 6-9 | 23 | 0 | 20M | 1 | | |
| | UMTS WCDMA | 3.84M | QPSK | 3.5 | 24 | 0 | 30M | 1 | | |
| Wide-band | LTE | 5M/10M/ 15M/20M | QPSK/ 16QAM/ 64QAM | 6-9 | 23 | 1 | — | 0 | Asyn. Sigma-Delta | 8.2-28.2 |
| | LTE-A | 40M | QPSK/ 16QAM/ 64QAM | 6-9 | 23 | 1 | — | 0 | | |

*UE Maximum Output Power for power Class 3

Various embodiments may relate to one or more supply modulators. The supply modulator may include two amplifiers, e.g., a Class AB amplifier and a Class D amplifier. The Class AB amplifier may be coupled to the Class D amplifier. The Class AB amplifier may be coupled to a bias current control block. The bias current control block may be configured to compare an input voltage ($v_{ENV}$) with a plurality of predetermined reference voltages and to control the operation of the Class AB amplifier according to the comparison results. For example, the operation of the Class AB amplifier may be controlled by adjusting the bias current of the Class AB amplifier. The quiescent current of the Class AB amplifier may thus be adjusted accordingly. The Class D amplifier may be coupled to a dual-mode Sigma-Delta control block. The dual-mode Sigma-Delta control block may be configured to receive an output signal from the Class AB amplifier, to convert the received (output) signal to a digital signal (or pulsed signal) and to control the switching frequency of the Class D amplifier according to the digital signal. In various embodiments, the bias current control block may be formed integrally with the Class AB amplifier,

504, the second amplifier circuit 506 being configured to generate a second electrical output signal for driving the electrical load, wherein the control circuit 504 is configured to generate a pulsed electrical signal based on the first electrical output signal, and further configured to supply, based on the pulsed electrical signal, an output control signal to the second amplifier circuit 506 for controlling generation of the second electrical output signal, wherein, the supply modulator 500 is configured, in a first mode of operation, for the first amplifier circuit 502 to generate the first electrical output signal in response to a quiescent current of the first amplifier circuit 502 being of a first magnitude that is fixed, for the control circuit 504 to sample the pulsed electrical signal in accordance with a clock signal received by the control circuit 504 to generate a modulated electrical signal as the output control signal, and for the second amplifier circuit 506, for generating the second electrical output signal, to operate at a first frequency in accordance with a temporal-related parameter of the modulated electrical signal, and, in a second mode of operation, for the first amplifier circuit 502 to generate the first electrical output signal in response to the quiescent current being of a second magnitude that is variable, for the control circuit 504 to provide the pulsed electrical signal as the output control signal, and for the second amplifier circuit 506, for generating the second electrical output signal, to operate at a second frequency in accordance with a temporal-related parameter of the pulsed electrical signal.

In other words, a supply modulator 500 may be provided. The supply modulator 500 may include a first amplifier circuit 502, a control circuit 504, and a second amplifier circuit 506. The first and second amplifier circuits 502, 506 and the control circuit 504 may be (electrically) coupled to each other. The first amplifier circuit 502 may generate a first electrical output signal (e.g., current) for driving an electrical load (e.g., an RF load), while the second amplifier circuit 506 may generate a second electrical output signal (e.g., current or voltage) for driving the electrical load. The control circuit 504 may generate a pulsed electrical signal (e.g., voltage; $v_C$) based on the first electrical output signal, and further configured to supply, based on the pulsed electrical signal, an (electrical) output control signal (e.g., voltage; $v_{C\_CLK}$) to the second amplifier circuit 506 for controlling generation of the second electrical output signal.

The supply modulator 500 may be operable in two modes of operation. In a first mode of operation (e.g., for narrowband applications, or in response to the supply modulator 500 receiving a narrowband (input) signal, or in response to the supply modulator 500 receiving a (input) signal with low frequency), the first amplifier circuit 502 may generate the first electrical output signal in response to a quiescent current (e.g., $I_Q$) of the first amplifier circuit 502 being of a first magnitude that may be fixed, the control circuit 504 may sample the pulsed electrical signal in accordance with a clock signal (e.g., $v_{CLK}$) received by the control circuit 504 to generate a modulated electrical signal (e.g., a pulse density modulated signal) as the output control signal, and the second amplifier circuit 506 may, for generating the second electrical output signal, operate at a first (switching) frequency in accordance with a temporal-related parameter of the modulated electrical signal. The magnitude of the first electrical output signal may be variable. The first electrical output signal may be the ripple current due to the switching of the second amplifier circuit 506. In a second mode of operation (e.g., for wideband applications, or in response to the supply modulator 500 receiving a wideband (input) signal), or in response to the supply modulator 500 receiving a (input) signal with high frequency), the first amplifier circuit 502 may generate the first electrical output signal in response to the quiescent current being of a second magnitude that is variable, the control circuit 504 may provide the pulsed electrical signal as the output control signal, and the second amplifier circuit 506 may, for generating the second electrical output signal, operate at a second (switching) frequency in accordance with a temporal-related parameter of the pulsed electrical signal. In both operation modes, the quiescent current may be supplied by an external power supply and received by the first amplifier circuit 502.

Accordingly, in various embodiments, in the first mode of operation, the first (switching) frequency may be controllable by means of the clock signal, while, in the second mode of operation, the second (switching) frequency may be adjustable/variable according to the pulsed electrical signal. The first (switching) frequency may be reduced as a result of use of the clock signal in the operation of the supply modulator 500. In the first mode of operation, the first frequency may be reduced compared to a mode of operation where there is no clock signal or when the supply modulator 500 operates in asynchronous (Sigma-Delta) mode. Further, the first (switching) frequency may be reduced as compared to known designs where no clock signals are used in operations. As a non-limiting example, for the purpose of comparison, where there is no clock signal being used in the first mode of operation, the associated switching frequency may be determined by several parameters such as hysteresis range of a hysteresis comparator, inductor, etc., and the mathematical expression for switching frequency may be as shown in Equation (1). When a clock signal is used or added, the switching frequency is reduced to the clock frequency.

In various embodiments, a clock signal is utilised or employed for operation of the supply modulator 500 in the first mode of operation, while the clock signal is not utilised or employed for operation of the supply modulator 500 in the second mode of operation.

In various embodiments, the first frequency may be lower than the second frequency. In further embodiments, the first frequency may be higher than the second frequency. As non-limiting examples, the supply modulator 500 may be designed with the first (switching) frequency of about 25 MHz, and the second (switching) frequency from <5 MHz to about 60 MHz. Please also see FIG. 3A.

In various embodiments, a switching frequency of the second amplifier circuit 506 may be reduced as a result of a clock signal. For example, with the clock signal, the maximum switching frequency is the clock frequency, while on the other hand, if no clock signal is used, the maximum switching frequency is higher.

In various embodiments, the clock rate/sampling frequency, $f_{CLK}$, of the clock signal may be selected according to the bandwidth of the communications standard or application.

Hysteresis of or associated with the control circuit 504 may be minimised or reduced in the second mode of operation as compared to that in the first mode of operation. In the second mode of operation, hysteresis of or associated with the control circuit 504 may be minimised and controlled by the inherent propagation delay of the supply modulator 500. This may mean that only the inherent propagation delay of the supply modulator 500 contributes to the hysteresis and, therefore, the hysteresis is minimised.

In various embodiments, the control circuit 504 may be formed as part of the second amplifier circuit 506. The control circuit 504 may be formed integrally with the second amplifier circuit 506.

In various embodiments, the first amplifier circuit 502 may include a pair of output power transistors (electrically) coupled to each, and further electrically coupled to the control circuit 504. The pair of output power transistors may be of opposite conductivity types. The pair of output power transistors may include a P-type FET (Field Effect Transistors) (e.g., PMOS transistor, i.e., p-channel MOSFET or P-type FinFET, i.e., Fin FET), and an N-type FET (e.g., NMOS transistor, i.e., n-channel MOSFET, N-type FinFET). In further embodiments, the pair of output power transistors may be of the same conductivity type.

As a non-limiting example, the first amplifier circuit 502 may include or may be a Class AB amplifier. The first electrical output signal may be a current $i_{AB}$.

As a non-limiting example, the second amplifier circuit 506 may include or may be a Class D amplifier. The second electrical output signal may be a current $i_D$ or a voltage $V_D$.

In the context of various embodiments, with the supply modulator 500 being operable in two modes of operation, the control circuit 504 may be a dual-mode control circuit.

As a non-limiting example, the control circuit 504 may include or may be a Sigma-Delta control circuit (or a Sigma-Delta control block). In the first mode of operation, the control circuit 504 may operate in a synchronous mode (e.g., synchronous Sigma-Delta mode) where a clock signal may be utilised in the operation of the supply modulator 500. In the second mode of operation, the control circuit 504 may operate in an asynchronous mode (e.g., asynchronous Sigma-Delta mode) where no clock signal is utilised in the operation of the supply modulator 500.

In the context of various embodiments, the magnitude of the first electrical output signal in the second mode of operation may be higher than the magnitude of the first electrical output signal in the first mode of operation.

In the context of various embodiments, the second magnitude of the quiescent current may be higher than the first magnitude of the quiescent current. The quiescent current in the first mode of operation may be low. The quiescent current in the second mode of operation may be high.

In the context of various embodiments, the pulsed electrical signal may include a reference to a digital-like electrical signal or a digital signal.

In the context of various embodiments, a temporal-related parameter in the context of an electrical signal may include a reference to time (e.g., period), or the associated frequency, of the electrical signal.

In the context of various embodiments, the term "driving" in the context of an electrical load means that an electrical signal is supplied to the electrical load.

In various embodiments, the supply modulator 500 may further include a current controller circuit, wherein, in the second mode of operation, the current controller circuit may be configured to receive an (electrical) input signal (e.g., input voltage), compare a magnitude of the input signal against a plurality of reference magnitude levels (e.g., reference voltages or reference voltage levels), and adjust a magnitude of at least one bias current for the first amplifier circuit 502 in accordance with results of the comparison against the plurality of reference magnitude levels, and the supply modulator 500 may be configured for the first amplifier circuit 502 to generate the first electrical output signal in response to the quiescent current and the at least one bias current. At least some of the plurality of reference magnitude levels may be different to one another. In the second mode of operation, the current controller circuit may be enabled or in an "ON" state. In the first mode of operation, the current controller circuit may be disabled or in an "OFF" state. The current controller circuit may refer to a bias current control block.

The current controller circuit may be electrically coupled to the first amplifier circuit 502. The current controller circuit may be formed external to the first amplifier circuit 502. The current controller circuit may be formed as part of the first amplifier circuit 502. The current controller circuit may be formed integrally with the first amplifier circuit 502.

The current controller circuit may include a plurality of comparators, and a plurality of switches, wherein each switch of the plurality of switches may be associated with a respective comparator of the plurality of comparators, wherein, for adjusting the magnitude of the at least one bias current, for each comparator of the plurality of comparators, the comparator may be configured to compare the magnitude of the input signal against a respective reference magnitude level of the plurality of reference magnitude levels, and the switch associated with the comparator may be configured to be in one of two states in accordance with result of the comparison corresponding to the comparator.

In various embodiments, the first amplifier circuit 502 may include a first circuit (or input circuit), a second circuit (or intermediate circuit), and a third circuit (or output circuit) electrically coupled to each other, wherein the first circuit may be configured to receive the input signal, and further configured to provide gain to the input signal for generating the first electrical output signal, and wherein the second circuit may be configured to provide, based on the at least one bias current, one or more biasing voltages to the third circuit to control the third circuit for generating the first electrical output signal.

The first circuit (or first stage circuit) may be a high gain stage and may amplify the input signal. The second circuit (or middle stage circuit) may provide one or more biasing voltages to the third circuit (or output stage circuit), which in turn may provide the first electrical output signal to the electrical load. The second circuit may be electrically coupled to the current controller circuit. The third circuit may include the pair of output power transistors described above. In various embodiments, the bias current, and, hence the one or more biasing voltages, may vary according to the input signal (e.g., input voltage) and controlled through the current controller circuit.

In various embodiments, the gain of the first circuit, and, therefore, the gain of the first amplifier circuit 502 and also the gain of the supply modulator 500 may, generally, be 1. If the gain of the first circuit, and, therefore, also those of the first amplifier circuit 502 and the supply modulator 500 is not 1, for example, >1, the supply modulator 500 may be modelled as a pre-amplifier with a gain, and a unity-gain supply modulator. Therefore, for the same output signal of the supply modulator 500, the first electrical output signal may be independent of the gain of the supply modulator 500.

In various embodiments, the control circuit 504 may include a comparator configured to generate the pulsed electrical signal based on the first electrical output signal. The comparator may be electrically coupled to the first amplifier circuit 502. The comparator may be without hysteresis or with minimal hysteresis. The comparator may include or may be a current comparator or a voltage comparator.

In various embodiments, the control circuit 504 may include a sampling circuit, wherein the supply modulator 500 may be configured, in the first mode of operation, for the sampling circuit to sample the pulsed electrical signal in accordance with the clock signal to generate the modulated electrical signal as the output control signal, and, in the second mode of operation, for the sampling circuit to pass through the pulsed electrical signal as the output control signal. The clock signal may be received by the sampling circuit. In the first mode of operation, the sampling circuit may be enabled or in an "ON" state. In the second mode of operation, the sampling circuit may be disabled or in an "OFF" state.

In various embodiments, the sampling circuit may be electrically coupled to the comparator of the control circuit 504. The sampling circuit may receive an output signal of the comparator of the control circuit 504.

In the context of various embodiments, the sampling circuit may be or may include a flip-flop circuit (e.g., a D flip-flop, DFF).

In various embodiments, the control circuit 504 may include a sensing circuit, wherein the sensing circuit may be configured, for generating the pulsed electrical signal, to generate a sensing electrical signal based on the first electrical output signal, the sensing electrical signal having a magnitude that may be scaled by a defined factor relative to a magnitude of the first electrical output signal. The sensing circuit may be electrically coupled to the first amplifier circuit 502.

In the context of various embodiments, the sensing circuit may include or may be realised using one or more sensing (electrical) elements. As a non-limiting example, the sensing circuit may include or may be realised using a pair of sensing transistors (electrically) coupled to each other. The pair of sensing transistors may be at least substantially matched to the pair of output power transistors of the first amplifier circuit 502. The pair of sensing transistors may be of opposite conductivity types. The pair of sensing transistors may include a P-type FET (Field Effect Transistors) (e.g., PMOS transistor, i.e., p-channel MOSFET or P-type FinFET, i.e., Fin FET), and an N-type FET (e.g., NMOS transistor, i.e., n-channel MOSFET, N-type FinFET). In further embodiments, the pair of sensing transistors may be of the same conductivity type. As a further non-limiting example, the sensing circuit may include or may be realised using a resistor or a resistor pair.

In various embodiments, the second amplifier circuit 506 may include a pair of transistors (electrically) coupled to each other, wherein the pair of transistors is configured for generating the second electrical output signal. In some embodiments, the pair of transistors may be of opposite conductivity types. The pair of transistors may define an inverter (circuit). The pair of transistors may include a P-type FET (Field Effect Transistors) (e.g., PMOS transistor, i.e., p-channel MOSFET or P-type FinFET, i.e., Fin FET), and an N-type FET (e.g., NMOS transistor, i.e., n-channel MOSFET, N-type FinFET). In further embodiments, the pair of transistors may be of the same conductivity type (electrically) coupled to each other, for example, two n-type transistors.

The second amplifier circuit 506 may further include a sub-circuit electrically coupled to the pair of transistors, wherein the sub-circuit may be configured to introduce propagating delay to the output control signal supplied by the control circuit 504 to generate respective electrical signals to the pair of transistors for generating the second electrical output signal, the respective electrical signals being at least substantially non-overlapping temporally (i.e., not overlapping relative to time). The sub-circuit may include one or more delay circuits configured to introduce the propagating delay. The sub-circuit may include feedback electrical paths. The sub-circuit may help to minimise or prevent shoot-through, by minimising shoot-through current. A shoot-through refers to a short-circuit condition, which may occur, for example, when both transistors of the pair of transistors are on (or enabled, or conducting) at the same time.

In various embodiments, the supply modulator 500 may further include an inductor, $L_O$, to reduce a switching noise of the second amplifier circuit 506. The inductor may be electrically coupled to the second amplifier circuit 506. The inductor may be formed external to the second amplifier circuit 506. The inductor may be formed as part of the second amplifier circuit 506.

The inductor may be formed integrally with the second amplifier circuit 506.

The inductor may also affect the slew rate of the second amplifier circuit 506, and the transition between the first mode of operation and the second mode of operation. This may mean that the inductor may be configured for controlling a slew rate of the second amplifier circuit 506 for determining a transition frequency for the supply modulator to transition between the first mode of operation and the second mode of operation. Further, it should be appreciated that the slew rate and the transition may also be affected by one or more other parameters, including the design of the first amplifier circuit 502 and/or the design of the second amplifier circuit 506.

Figure 5B:
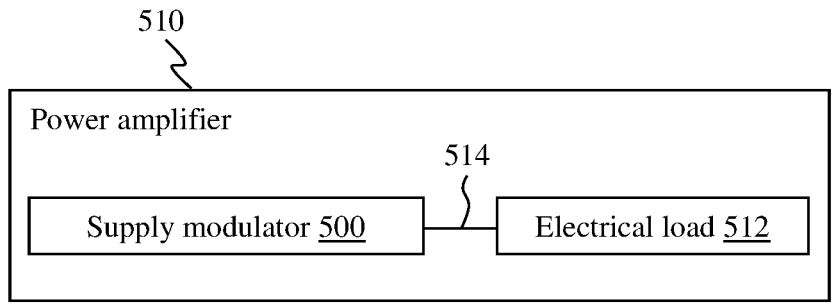
FIG. 5B shows a schematic block diagram of a power amplifier, according to various embodiments.

FIG. 5B shows a schematic block diagram of a power amplifier 510, according to various embodiments. The power amplifier 510 includes the supply modulator 500, and an electrical load 512 (e.g., RF load) electrically coupled (as represented by the line 514) to the supply modulator 500, wherein the supply modulator 500 is configured to receive an input (electrical) signal (e.g., voltage), and further configured to track an envelope of the input signal for generating the first electrical output signal and the second electrical output signal for driving the electrical load 512. It should be appreciated that description in the context of the supply modulator 500 may correspondingly be applicable in relation to the power amplifier 510.

Figure 5D:
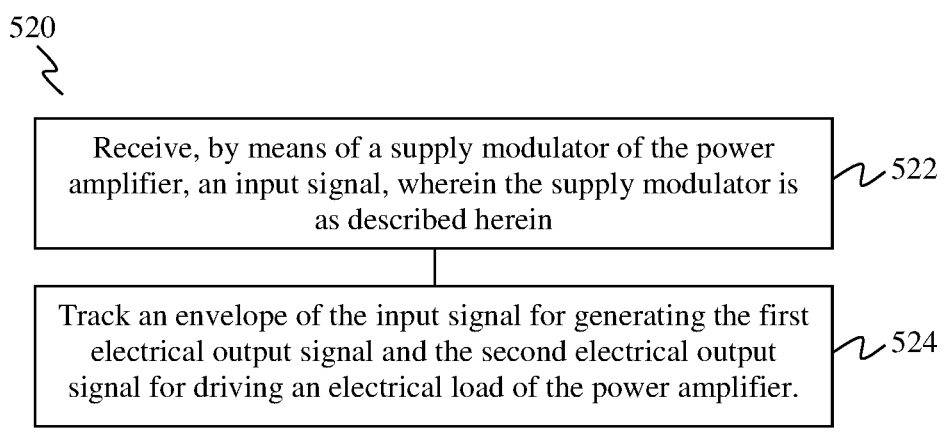
FIG. 5D shows a flow chart illustrating a method for controlling a power amplifier, according to various embodiments.
Figure 5C:
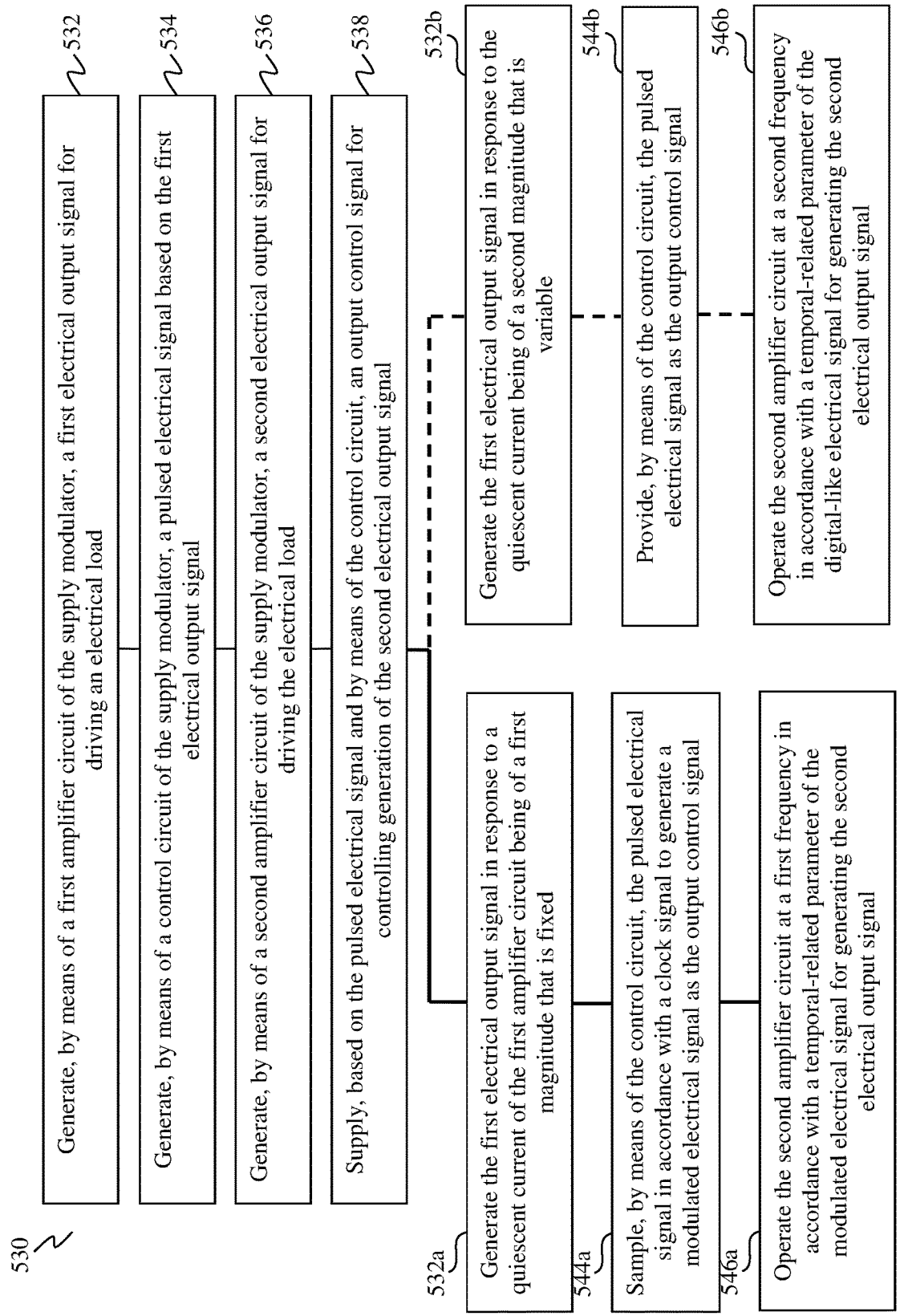
FIG. 5C shows a flow chart illustrating a method for controlling a supply modulator, according to various embodiments.

FIG. 5C shows a flow chart 530 illustrating a method for controlling a supply modulator, according to various embodiments.

At 532, a first electrical output signal is generated, by means of a first amplifier circuit of the supply modulator, for driving an electrical load.

At 534, a pulsed electrical signal is generated, by means of a control circuit of the supply modulator, based on the first electrical output signal.

At 536, a second electrical output signal is generated, by means of a second amplifier circuit of the supply modulator, for driving the electrical load.

At 538, an output control signal is supplied, based on the pulsed electrical signal and by means of the control circuit, for controlling generation of the second electrical output signal.

In a first mode of operation, at 532a, the first electrical output signal is generated in response to a quiescent current of the first amplifier circuit being of a first magnitude that is fixed, at 544a, the pulsed electrical signal is sampled, by means of the control circuit, in accordance with a clock signal (received by the control circuit) to generate a modulated electrical signal as the output control signal, and, at 546a, the second amplifier circuit is operated at a first frequency in accordance with a temporal-related parameter of the modulated electrical signal for generating the second electrical output signal.

In a second mode of operation, at 532b, the first electrical output signal is generated in response to the quiescent current being of a second magnitude that is variable, at 544b, the pulsed electrical signal is provided, by means of the control circuit, as the output control signal, and, at 546b, the second amplifier circuit is operated at a second frequency in accordance with a temporal-related parameter of the pulsed electrical signal for generating the second electrical output signal.

In various embodiments, the first frequency may be lower than the second frequency.

In various embodiments, in the second mode of operation, at 532b, the method may include (by means of a current controller circuit of the supply modulator) receiving an input signal, comparing a magnitude of the input signal against a plurality of reference magnitude levels, and adjusting a magnitude of at least one bias current for the first amplifier circuit in accordance with results of the comparison against the plurality of reference magnitude levels, wherein generating the first electrical output signal may include generating the first electrical output signal in response to the quiescent current and the at least one bias current.

In various embodiments, at 534, a sensing electrical signal may be generated based on the first electrical output signal for generating the pulsed electrical signal, the sensing electrical signal having a magnitude that may be scaled by a defined factor relative to a magnitude of the first electrical output signal.

The method may further include introducing, by means of the second amplifier circuit, propagating delay to the output control signal to generate respective electrical signals to a pair of transistors of the second amplifier circuit for generating the second electrical output signal, the pair of transistors being coupled to each other, and the respective electrical signals being at least substantially non-overlapping temporally.

The method may further include controlling (e.g., by means of at least an inductor) a slew rate of the second amplifier circuit for determining a transition frequency for the supply modulator to transition between the first mode of operation and the second mode of operation.

The method may further include reducing, by means of an inductor, a switching noise of the second amplifier circuit.

It should be appreciated that description in the context of the supply modulator 500 may correspondingly be applicable in relation to the method for controlling a supply modulator described in the context of the flow chart 530, and vice versa.

FIG. 5D shows a flow chart 520 illustrating a method for controlling a power amplifier, according to various embodiments. The power amplifier may be the power amplifier 510 of FIG. 5B.

At 522, an input signal is received, by means of a supply modulator of the power amplifier, wherein the supply modulator is as described herein, for example, the supply modulator 500 (FIG. 5A).

At 524, an envelope of the input signal is tracked for generating the first electrical output signal and the second electrical output signal for driving an electrical load of the power amplifier.

It should be appreciated that description in the context of the supply modulator 500 may correspondingly be applicable in relation to the method for controlling a power amplifier described in the context of the flow chart 520.

The design and operation of the supply modulator of various embodiments will now be described in further detail. To address the above-mentioned design challenges for multi-standard applications, the supply modulator may include a dual-mode Sigma-Delta control and an adaptive biasing Class AB amplifier.

System Architecture

Figure 6:
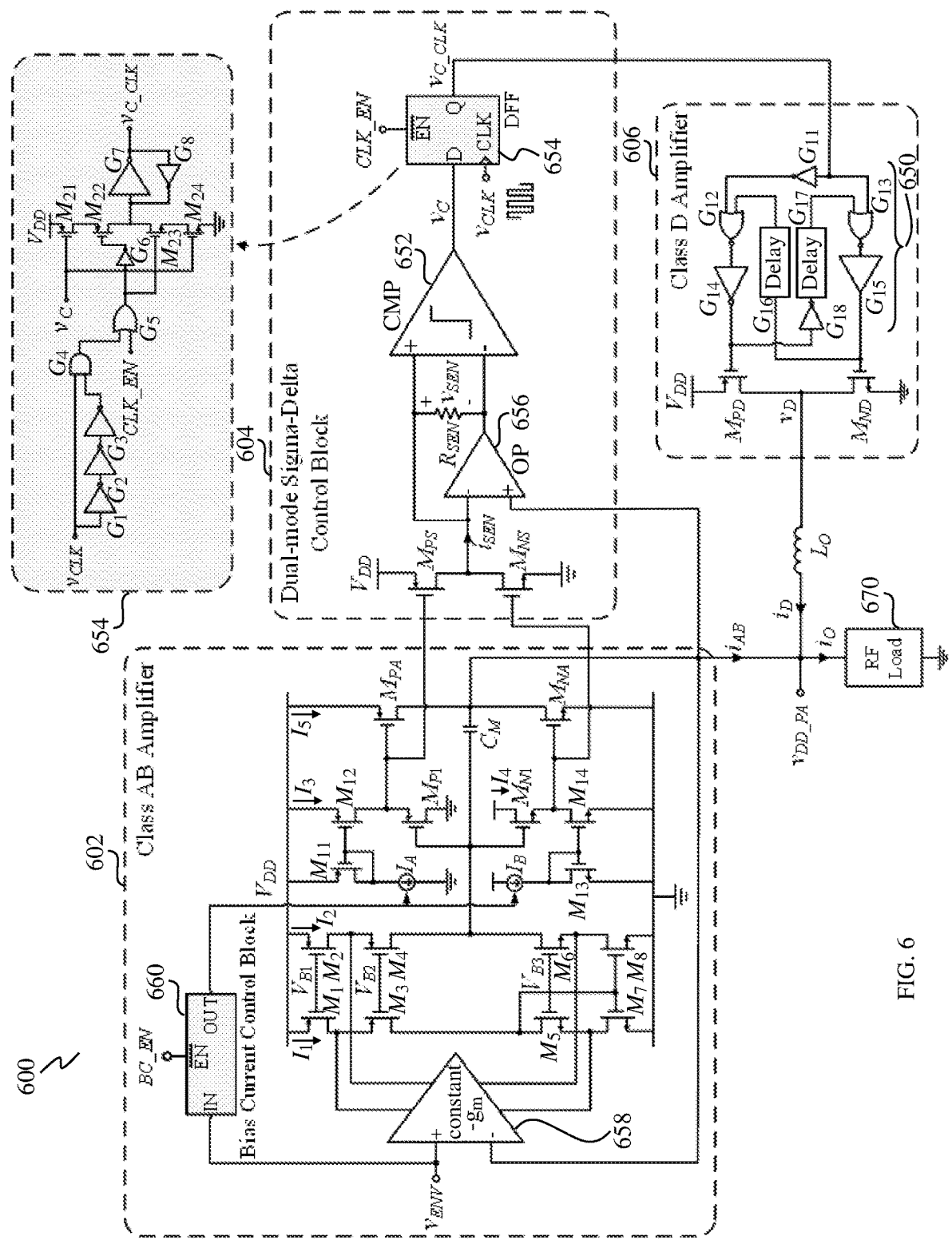
FIG. 6 shows a schematic diagram of a supply modulator, according to various embodiments.

FIG. 6 shows a schematic diagram of a supply modulator 600, according to various embodiments. The supply modulator 600 may include a dual-mode Sigma-Delta control 604, a Class AB amplifier 602 with adaptive bias current, and a high-efficiency Class D amplifier 606 including an anti-shoot-through driver 650, and an output inductor $L_O$. The sensing transistors, $M_{PS}$ and $M_{NS}$, in the control block 604 may be designed to match the output power transistors of the Class AB amplifier 602, $M_{PA}$ and $M_{NA}$. By this means, the sensing current, $i_{SEN}$, in the control block 604 may be a scaled version of the current, $i_{AB}$, of the Class AB amplifier 602, with ratio k (i.e., $i_{SEN}=1/k*i_{AB}$). The comparator 652 in the dual-mode Sigma-Delta control 604 may be realised by either a voltage comparator or a current comparator. Using a voltage comparator as a non-limiting example, $i_{SEN}$ is converted to a voltage, $V_{SEN}$, by the resistor $R_{SEN}$ connected across the input terminals of the comparator 652. By sensing the magnitude and polarity of $V_{SEN}$, the comparator 652 in the control block 604 may generate a digital-like signal (or pulsed signal), $v_C$, which may switch between the supply rail voltage, $V_{DD}$, and ground. The signal, $v_C$, may be provided to a sampling circuit, e.g., a D flip-flop (DFF) 654, and the output, $v_{C\_CLK}$, of the DFF 654 may control the output voltage, $v_D$, and the output current, $i_D$, of the Class D amplifier 606 via the anti-shoot-through driver 650 to prevent large shoot-through current. The load current, $i_O$, is the sum of $i_{AB}$ and $i_D$. $i_O$ represents the output current and $V_{DD\_PA}$ represents the output voltage. In this architecture, a large-signal negative feedback loop is effectively established—when $i_{AB}$ is positive, the Class D amplifier 606 is 'on' (i.e., $v_D=V_{DD}$ and $i_D$ increases) to provide more current. Conversely, when $i_{AB}$ is negative, the Class D amplifier 606 is 'off' (i.e., $v_D=0$ and $i_D$ decreases).

Dual-Mode Sigma-Delta Control

The Sigma-Delta control circuit 604 may include a pair of sensing transistors, $M_{PS}$ and $M_{NS}$, coupled to each other and to provide the sensing current, $i_{SEN}$, to the inverting input of an opamp (OP) 656. As may be appreciated, the sensing transistor, $M_{PS}$, is a PMOS (p-type metal-oxide-semiconductor) transistor while the other sensing transistor, $M_{NS}$, is an NMOS (n-type metal-oxide-semiconductor) transistor. The inverting input (−) of the opamp 656 may be electrically coupled to the resistor $R_{SEN}$ and to one input terminal (+) of the comparator 652, while the output of the opamp 656 may be electrically coupled to the other input terminal (−) of the comparator 652. The non-inverting input (+) of the opamp 656 may be electrically coupled to the Class AB amplifier 602.

The D input of the DFF 654 may be electrically coupled to the output of the comparator 652 to receive the digital-like signal, $v_C$. Clock signal, vax, may be provided to the clock input of the DFF 654. An enable signal, CLK_EN, may be provided to the DFF 654. The Q output of the DFF 654 may be electrically coupled to the Class D amplifier 606 to supply the output signal, $v_{C\_CLK}$. As shown in FIG. 6, the DFF 654 may be defined by a plurality of logic gates $G_1$-$G_8$, a plurality of PMOS transistors $M_{21}$-$M_{22}$, and a plurality of NMOS transistors $M_{23}$-$M_{24}$.

For narrowband applications, the DFF 654 may be enabled (e.g., CLK_EN=0) and the supply modulator 600 may operate with synchronous Sigma-Delta control. In this mode, the DFF 654 may sample the comparator output, $v_C$, at the rising edge of the clock signal $v_{CLK}$, and the output, $v_{C\_CLK}$, of the DFF 654 may be a pulse density modulated signal. The quantization noise of the Class D amplifier 606 arising from the finite clock rate may be primarily attenuated by the Class AB amplifier 602 in parallel. To obtain high power-efficiency over a wide range of communication standards, the clock rate/sampling frequency $f_{CLK}$ may be selected according to the bandwidth of the communications standard. This is to achieve optimised switching frequency (see Equation (2)); see also Table 1 above. For example, with $f_{CLK}$=20 MHz, the switching frequency for tracking low-frequency signals (such as GSM EDGE) may be ~10 MHz. Compared to the known hysteresis control, the synchronous Sigma-Delta control may achieve a higher power-efficiency for multi-standard applications without compromising the hardware simplicity.

For wideband applications, the supply modulator 600 may operate with asynchronous Sigma-Delta control by disabling the DFF 654 (e.g., CLK_EN=1), and $v_{C\_CLK}$ follows $v_C$. Instead of the hysteresis comparator in the known hysteresis control, the control block 604 may embody or include a simple comparator without hysteresis, i.e., $I_T$=0. This is because, as mentioned earlier, the hysteresis may undesirably generate delay/phase lag in the Class D amplifier 606 for wideband applications, thereby decreasing the power-efficiency. In the design disclosed herein, the hysteresis may be minimal, which may depend (only) on the inherent delay of the supply modulator 600.

Figure 7A:
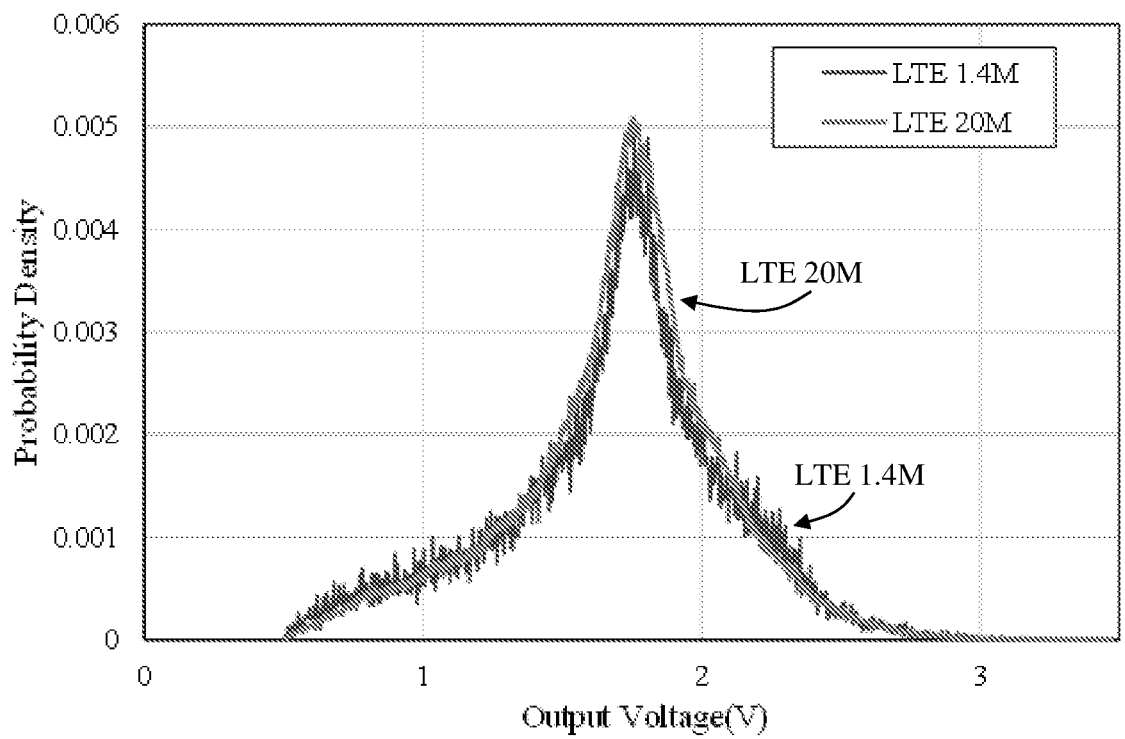
FIGS. 7A and 7B show the probability density function (PDF) and power spectral density (PSD) respectively of envelop signals extracted from 1.4 MHz LTE and 20 MHz LTE signals.
Figure 7B:
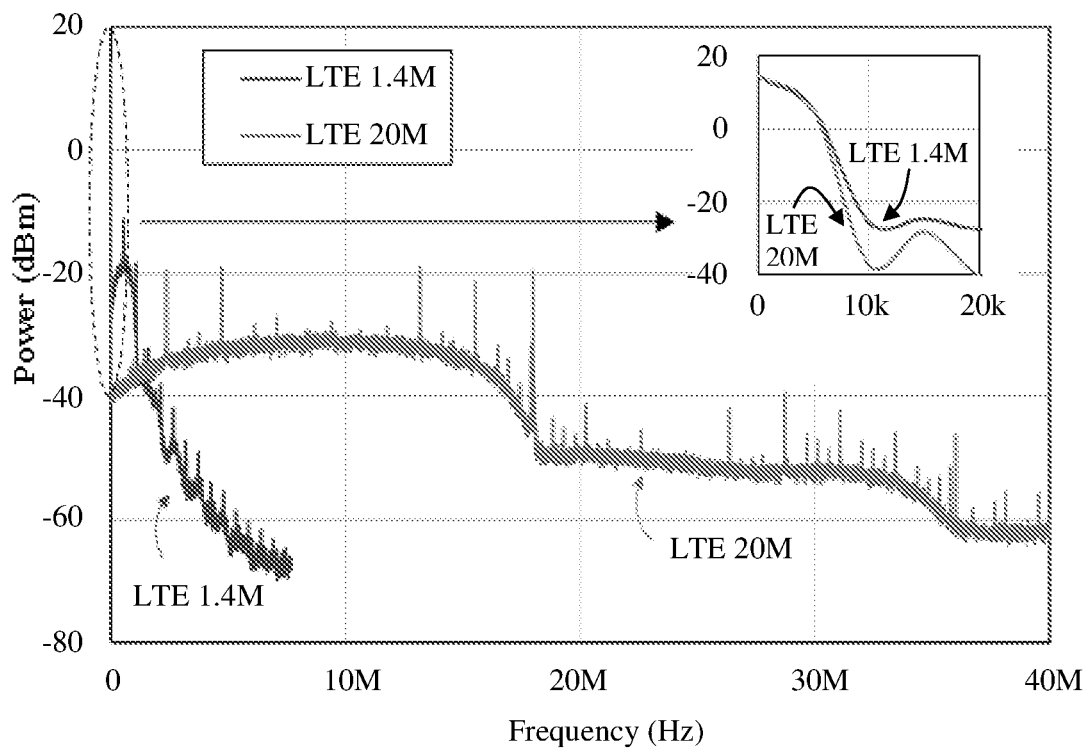

To illustrate the operation of the supply modulator 600, two envelope signals extracted from 20 MHz and 1.4 MHz LTE standards are applied as non-limiting examples. The former is to illustrate the wideband application and the latter is to illustrate the narrowband application. The probability density function (PDF) and power spectral density (PSD) of the envelop signals are respectively depicted in FIGS. 7A and 7B. The two envelope signals have a similar PDF, as may be observed in FIG. 7A, and the power in both cases are primarily within the DC to 10 kHz frequency range.

The current waveforms for tracking 20 MHz LTE envelope signals are shown in FIG. 7C. In this case, the supply modulator 600 operates in the wideband mode, i.e., DFF 654 is disabled and the asynchronous Sigma-Delta control is employed. It can be seen from FIG. 7C that the switching frequency may be largely the same as the input (output) frequency. FIG. 7D depicts the waveform of the supply modulator 600 when tracking a narrowband signal of a 1.4 MHz LTE envelope signal. To illustrate the efficacy of the synchronous Sigma-Delta control (with DFF 654 enabled), FIG. 7E shows the waveforms by using asynchronous Sigma-Delta control (with DFF 654 disabled). It may be seen that by using synchronous Sigma-Delta control, the switching frequency of the supply modulator 600 may be significantly reduced, from a high ~25 MHz (FIG. 7E) to a low ~8 MHz (FIG. 7D), translating to an improved power-efficiency from about 79% to about 82%.

Adaptive biasing Class AB Amplifier

To improve the power-efficiency of the supply modulator 600 over a wide range of communication standards with various output-power levels, a Class AB amplifier 602 with adaptive bias current may be provided. The Class AB amplifier 602 may include a constant-gm opamp 658, a bias current control circuit (or current controller circuit) 660 and a plurality of transistors. An input of the bias current control circuit 660 may be electrically coupled to the non-inverting input (+) of the opamp 658, which may receive a signal, for example, an envelop signal, $V_{ENV}$. Further, an enable signal, BC_EN, may be provided to the bias current control circuit 660. The inverting input (−) of the opamp 658 may be electrically coupled to the non-inverting input (+) of the opamp 656. The plurality of transistors may be electrically coupled to each other and may be electrically coupled to the opamp 658. The plurality of transistors may include a plurality of PMOS transistors $M_1$-$M_4$, $M_{11}$-$M_{12}$, $M_{P1}$, $M_{P4}$ and a plurality of NMOS transistors $M_5$-$M_8$, $M_{13}$-$M_{14}$, $M_{N1}$, $M_{NA}$. The Class AB amplifier 602 may provide an output current, $i_{AB}$, for driving an electrical load, for example, an RF load 670. $i_{AB}$ may be fed back to the inverting input of the opamp 658.

The Class AB amplifier 602 may be a three-stage amplifier. The first stage (or first circuit) may include a rail-to-rail input stage with a constant-gm technique and a folded-cascode amplifier to achieve a stable and relatively high open-loop gain, and may be defined by the opamp 658 and transistors $M_1$-$M_8$. The middle (or intermediate) stage (or second circuit) may include two source followers that are designed to work as a buffer, and may be defined by $M_{11}$-$M_{14}$, $I_A$, $I_B$, $M_{P1}$, and $M_{N1}$. The bias current control circuit 660 may also form part of the middle stage. The output stage (or third circuit) may include the transistors $M_{PA}$ and $M_{NA}$. The first stage may provide a high gain, the middle stage may provide the bias voltage to the output stage, such that the output stage may operate in Class AB mode. In various embodiments, the requirement of rail-to-rail output swing together with a high maximum output current over quiescent current ratio may dictate the use of a complementary Class AB common-source output stage.

The bias current control block 660 may control the bias currents, $I_A$, $I_B$, for the transistors $M_{12}$, $M_{14}$ respectively. $I_A$ and $I_B$ are generally independent, although they can be the same but not necessarily so. However, as both $I_A$ and $I_B$ are controlled by the bias current control block 660, when $I_B$ increases, $I_A$ also increases, and vice versa.

Figures 8A, 8B:
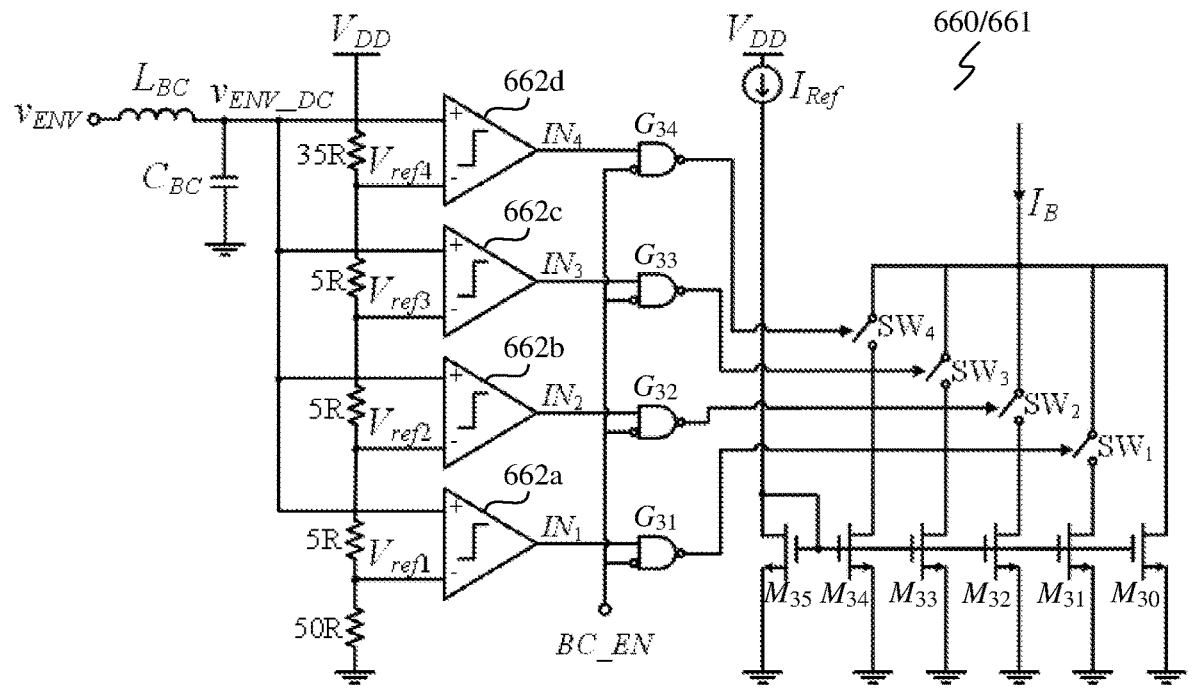

The block diagram of the bias current control block 660 is depicted in FIG. 8A as a non-limiting example. While the bias current control block 660, with the circuit 661, is illustrated in FIG. 8A for controlling $I_B$, it should be appreciated that, in various embodiments, the circuit 661 shown in FIG. 8A may be used for controlling both $I_A$ and $I_B$ (i.e., the same control circuit 661 may be shared for $I_A$ and $I_B$). In further embodiments, the bias current control block 660 may include a plurality of sub-circuits, one sub-circuit for controlling $I_A$, and another sub-circuit for controlling $I_B$, with each sub-circuit being at least substantially similar to the circuit 661. In yet further embodiments, other suitable control circuit(s) and/or sub-circuit(s) may be designed for the bias current control block 660 for controlling $I_A$ and/or $I_B$. It should be appreciated that, for description in the context of FIG. 8A, a reference to the bias current h may include a reference to IA, or to both bias currents $I_A$ and $I_B$, depending on the design of the bias current control block 660.

The circuit 661 may include a plurality of comparators, which, as a non-limiting example, may include four comparators 662a, 662b, 662c, 662d. The bias current control circuit 660, and, therefore, the circuit 661 may receive the signal, $V_{ENV}$. The corresponding DC component, $V_{ENV\_DC}$, may be obtained and then compared, via the comparators 662a, 662b, 662c, 662d, against a plurality of reference voltages, $V_{ref1}$, $V_{ref2}$, $V_{ref3}$, $V_{ref4}$, that may be derived from the supply rail voltage, $V_{DD}$. A corresponding number of logic gates $G_{31}$-$G_{34}$ may be provided to receive, as inputs, respective outputs $IN_1$-$IN_4$, from the corresponding comparators 662a, 662b, 662c, 662d, and the enable signal, BC_EN. A corresponding number of switches $SW_1$-$SW_4$ may be provided, where the respective outputs from the logic gates $G_{31}$-$G_{34}$ may be used to control the operation of the switches $SW_1$-$SW_4$. The circuit 661 may further include a plurality of NMOS transistors $M_{30}$-$M_{35}$, where the switches $SW_1$-$SW_4$ may be associated with respective transistors $M_{31}$-$M_{34}$ for supplying bias current $I_B$ to the transistors $M_{31}$-$M_{34}$. FIG. 8B illustrates the corresponding operations of the circuit 661.

In various embodiments, the switches $S_{W1}$-$S_{W4}$ may be implemented using either NMOS or PMOS transistors. In FIG. 8B, an "ON" state means that the transistors operate in ohmic region and their impedance is very low, while an "OFF" state means that the transistors operate in cut-off region and their impedance is high.

Referring to FIG. 6 and using the circuit 661 as a non-limiting example for $I_B$, the "OUT" terminal of the control block 660 represents a number of control signals to control the switches $SW_1$-$SW_4$. The bias current $I_B$ is the sum of the current in the transistor $M_{30}$ and the current(s) in the transistor(s) $M_{31}$-$M_{34}$ when their corresponding switches are closed (i.e., "ON" state). For example, if the switches $S_{W1}$ and $S_{W2}$ are closed but the switches $S_{W3}$ and $S_{W4}$ are open (i.e., "OFF" state), $I_B$ is the total current in the transistors $M_{30}$, $M_{31}$ and $M_{32}$. The switches $SW_1$-$SW_4$ may be implemented using an NMOS transistor (other implementation methods are also possible). If an NMOS transistor is used as a switch, the control signal (i.e., the ouput signals of logic gates $G_{31}$-$G_{34}$) is 1 to turn on (close) the corresponding switches $SW_1$-$SW_4$, and is 0 to turn off (open) the corresponding switches.

The modus operandi of the control block 660 is the adjustment of the bias current $I_B$ according to the bandwidth and the output power of the output signal, $V_{DD\_PA}$. In this manner, the quiescent current, $I_Q$, of Class AB amplifier 602 may be varied according to the input signal, $v_{ENV}$, thereby providing sufficient driving capability yet with minimal quiescent power loss. $I_Q$ may be controlled by $I_B$, which, in turn, may be controlled by the input signal $v_{ENV}$. The relationship between $V_{ENV}$, $I_B$ and $I_Q$ are shown in FIG. 8B. It should be appreciated that similar description may be applicable in relation to $I_A$, or in relation to a combination of $I_A$ and $I_B$.

In narrowband applications (see Table 1), the bias current control block 660 may be disabled (e.g., BC_EN=1) and $I_Q$ may be fixed to be 8.2 mA. This is because in narrowband applications, the Class AB amplifier 602 may serve to only provide ripple current and the amount of ripple current needed is usually small. Conversely, in wideband applications, the current required from the Class AB amplifier 602 may be higher and largely proportional to the output power of the supply modulator 600. This is because the Class AB amplifier 602 may need to provide both the ripple current and the AC component of the output signal, $v_{DD\_PA}$. In this case, the bias current control block 660 may be enabled (e.g., BC_EN=0) and the quiescent current, $I_Q$, of the Class AB amplifier 602 may or should be high and adjustable based on the output power of the output signal. In the design disclosed herein, $I_Q$ may be determined by the comparison between the DC voltage of the output signal, $V_{ENV\_DC}$, and the reference voltages, $V_{ref1}$, $V_{ref2}$, $V_{ref3}$, and $V_{ref4}$, as shown in FIG. 8A. $I_Q$ may range from about 8.2 mA to about 28.2 mA to meet the various communication standards. $I_Q$ is the total current drawn by the rail-to-rail input stage (first stage), the two source followers (middle stage), and the complementary Class AB common-source output stage. To be specific, with reference to FIG. 6, $I_Q$ includes $I_1$-$I_5$, $I_A$, $I_B$ and the current due to the bias current control block 660.

Figure 9A:
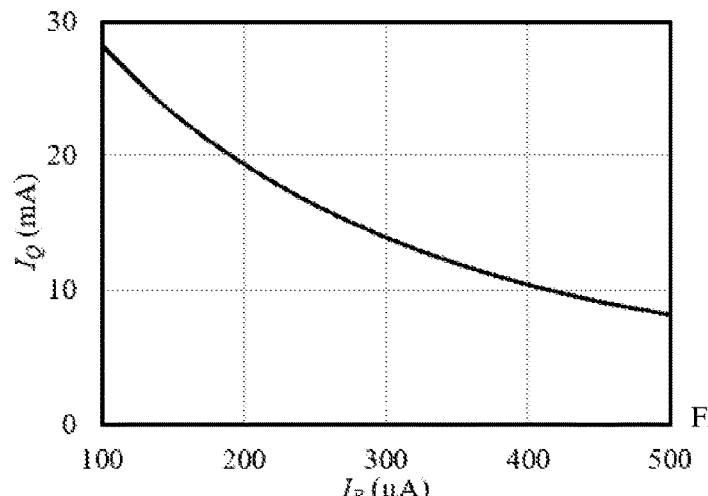
FIG. 9A shows a plot of simulated results of the quiescent current ($I_Q$) with biasing condition $I_B$.
Figure 9B:
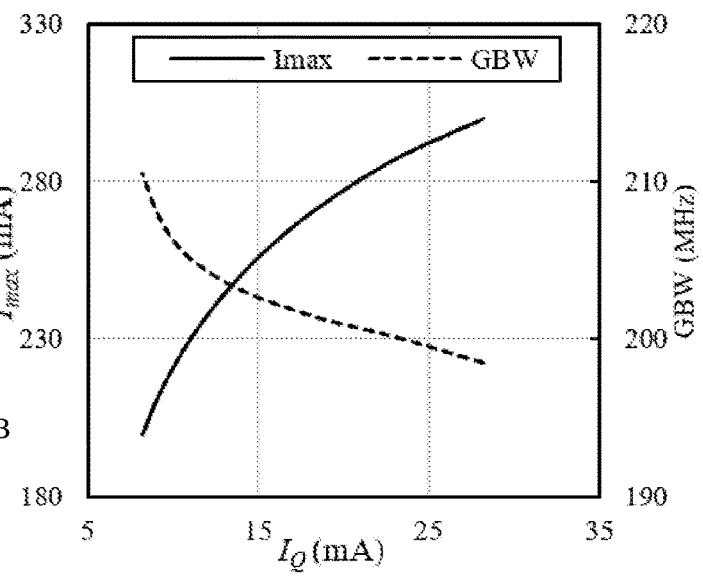
Figure 9C:
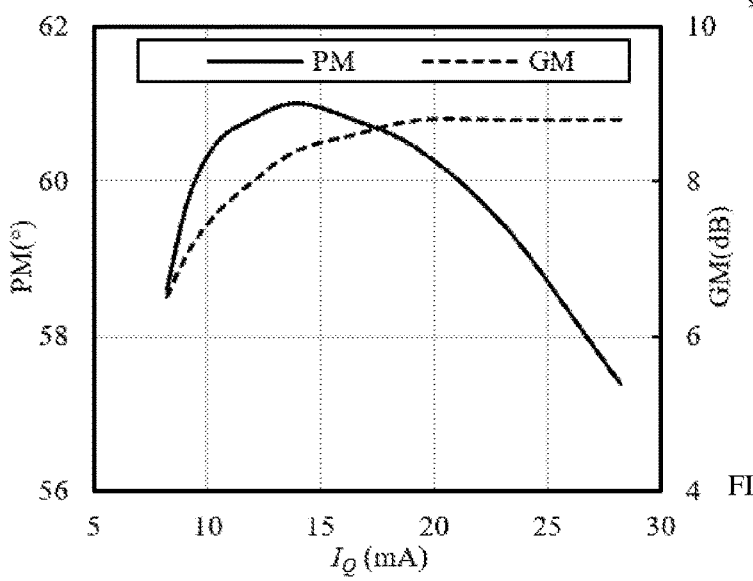
FIG. 9C shows a plot of simulated results of the phase margin (PM) and gain margin (GM) with various $I_Q$.

The large power transistors in the output stage, $M_{PA}$ and $M_{NA}$, may be designed to have a low open-loop output impedance and to provide sufficient current for tracking wideband applications. In the design of various embodiments, the bias current for the first stage may be separated from the middle stage. By controlling the bias current in the middle stage, i.e., $I_A$, $I_B$, $V_{GS}$ of the floating voltage source, $M_{P1}$, $M_{N1}$, may be adjusted. If $I_A$ and $I_B$ increase, $V_{GS}$ of $M_{P1}$, $M_{N1}$ are increased, hence the ensuing quiescent current for $M_{PA}$ and $M_{NA}$ is reduced. In this manner, the quiescent current for the power transistors $M_{PA}$ and $M_{NA}$, may be adaptively controlled. Since the size of the PMOS transistors may be designed to be ~2x the size of the NMOS transistors to maintain the same rising time and falling time, the bias current IA for the PMOS transistors may be designed to be 2x the bias current of h for the NMOS transistors. The relationship between $I_B$, $I_Q$ and bandwidth is shown in FIGS. 9A to 9C. FIG. 9A depicts $I_Q$ with various biasing condition $I_B$. By increasing the bias current h from about 100 μA to about 500 μA, the quiescent current $I_Q$ may be reduced by ~3.5x, from about 28.2 mA to about 8.2 mA. The maximum output current, $I_{max}$, and the gain-bandwidth product (GBW) of the Class AB amplifier 602 with various quiescent current, $I_Q$, are shown in FIG. 9B. The phase margin (PM) and the gain margin (GM) are shown in FIG. 9C to illustrate the stability. It may be seen that the Class AB amplifier 602 may maintain wide bandwidth (~200 MHz) and good stability over the whole quiescent current range. With $I_Q$=28.2 mA, the Class AB amplifier 602 may drive up to ~300 mA. As may be appreciated, the bias current $I_B$ affects the quiescent current $I_Q$ and consequently affects the bandwidth of the Class AB amplifier 602—to be specific, a smaller h results in high bandwidth but at the cost of higher $I_Q$ (i.e., higher power dissipation). The currents in the transistors $M_{PA}$ and $M_{NA}$ (FIG. 6) may be the dominant components in $I_Q$. When $I_A$ ($I_B$) increases, the current in $M_{PA}$ ($M_{NA}$) decreases. As a result, increasing $I_A$ and/or $I_B$ may result in reduced $I_Q$. See also FIG. 8B for the relationship between $I_B$ and $I_Q$.

Class D Amplifier

The Class D amplifier 606 may be electrically coupled to the Sigma-Delta control circuit 604. The Class D amplifier 606 may include a plurality of logic gates $G_{11}$-$G_{15}$, $G_{18}$, delay circuits or blocks $G_{16}$-$G_{17}$, and a pair of PMOS transistor $M_{PD}$ and NMOS transistor $M_{ND}$. The logic gates $G_{11}$-$G_{15}$, $G_{18}$, and delay circuits $G_{16}$-$G_{17}$ may define an anti-shoot-through driver 650. The pair of transistors $M_{PD}$, $M_{ND}$ may be coupled to each other and electrically coupled to the anti-shoot-through driver 650. The output power transistors, $M_{PD}$ and $M_{ND}$, may adopt a CMOS inverter topology. $M_{PD}$ and $M_{ND}$ are designed to feature a low switching loss and conduction loss to achieve high power-efficiency. To prevent large shoot-through current, the anti-shoot-through driver 650 is included in the Class D amplifier 606, which may contribute ~4 ns dead time. The anti-shoot through driver 650 may generate two non-overlapping signals at the gates of the transistors $M_{PD}$ and $M_{ND}$ by feeding back the two signals (i.e., output signals of gates $G_{14}$ and $G_{15}$) to $G_{12}$ and $G_{13}$, hence preventing a large anti shoot through current in the transistors $M_{PD}$ and $M_{ND}$.

The Class D amplifier 606 may provide an output voltage, VD (and the associated current $i_D$), for driving the load 670. The current $i_O$ is the sum of $i_{AB}$ and $i_D$.

An output inductor, $L_O$, may be provided, which affects the slew rate, $SRi_D$, of the Class D amplifier 606, and determines the transition frequency between the two cases (see FIG. 3A), i.e., transition between narrowband applications and wideband applications. A small $L_O$ increases $SRi_D$, but at a cost of increased switching noise. Moreover, the parasitic resistance of $L_O$ may contribute to the power loss from the inductor, where the inductor with higher inductance usually has a larger (worse) parasitic resistance. Considering the above-mentioned tradeoffs, an inductor value of about 4.7 μH may be preferably selected to optimise the performance of the supply modulator 600.

A change in the quiescent current $I_Q$ may not directly affect the operation of the Sigma-Delta control circuit 604 and/or the Class D amplifier 606. Nevertheless, as described herein, increasing $I_Q$ may increase the overall bandwidth of the supply modulator 600 but at the cost of increased power dissipation.

Measurement results will now be described by way of the following non-limiting examples.

Figure 10:
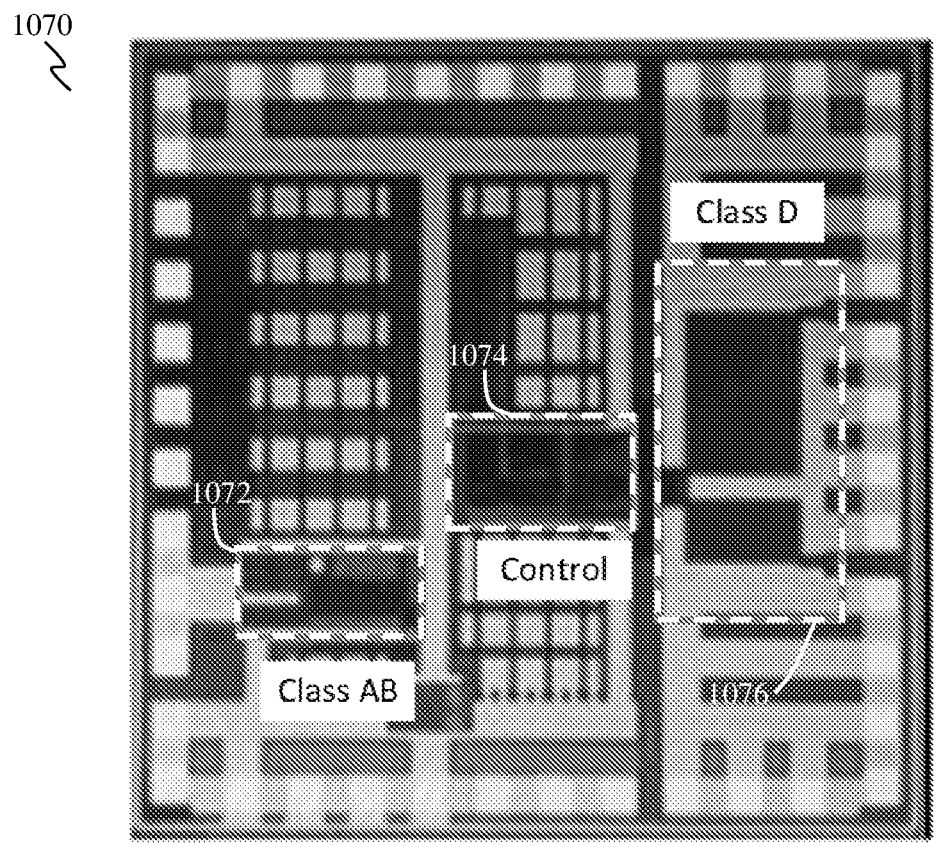
FIG. 10 shows a micrograph of a fabricated die.

FIG. 10 shows a micrograph 1070 of a fabricated die, showing the supply modulator fabricated using 180 nm CMOS process. The supply modulator includes a Class AB amplifier (located within the dashed box 1072), a dual-mode control (located within the dashed box 1074), and a Class D amplifier (located within the dashed box 1076). The total area of the IC (integrated circuit) is 2.25 mm² and it is packaged in a 4 mm×4 mm QFN (quad-flat no-lead) package. The output inductor $L_O$ is about 4.7 μH and decoupling capacitance at the output of the supply modulator is about 100 pF. The supply voltage is $V_{DD}$=3.6V. A resistive load of about 4Ω is used for measurements—this is a typical load used to qualify and quantify the performance of a supply modulator. The clock frequency for the synchronous Sigma-Delta mode is about 20 MHz unless otherwise stated.

Figure 11A:
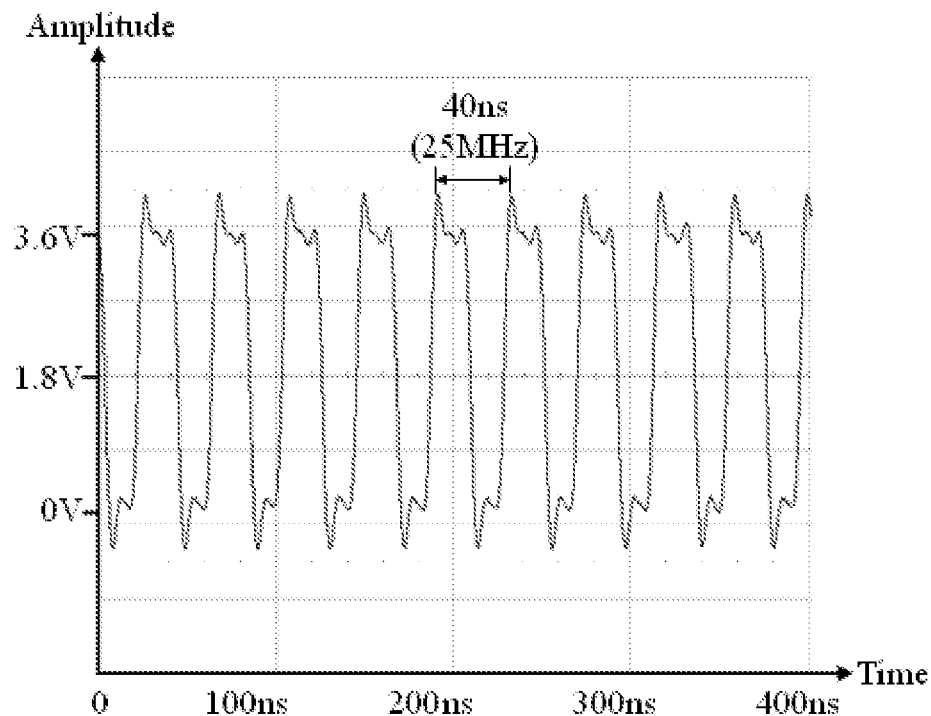
FIGS. 11A and 11B show output waveforms of the Class D amplifier at $v_{DD\_PA}$=1.8V with asynchronous mode and synchronous mode respectively.
Figure 11B:
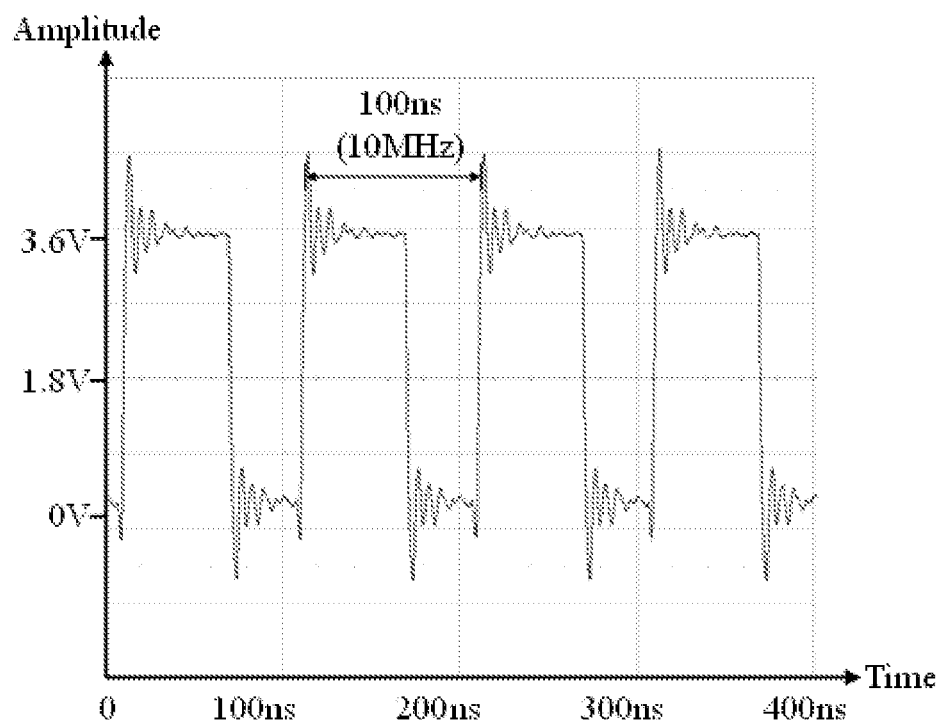

FIGS. 11A and 11B show output waveforms, $v_D$, of the Class D amplifier at $v_{DD\_PA}$=1.8V with asynchronous mode and synchronous mode respectively, illustrating VD for wideband application (asynchronous Sigma-Delta mode) and for narrowband application (synchronous Sigma-Delta mode). The input for both cases is a DC input and $v_{ENV}$=1.8V (0.8 W output power). For wideband applications (FIG. 11A), the DFF (e.g., 654; FIG. 6) is disabled and the switching frequency is a high 25 MHz—this is the maximum switching frequency of the supply modulator. For narrowband applications, (FIG. 11B), the DFF (e.g., 654; FIG. 6) is enabled and the switching frequency depends on the clock frequency. In this case, the switching frequency is about 10 MHz ($f_{CLK}$=20 MHz).

Figure 12A:
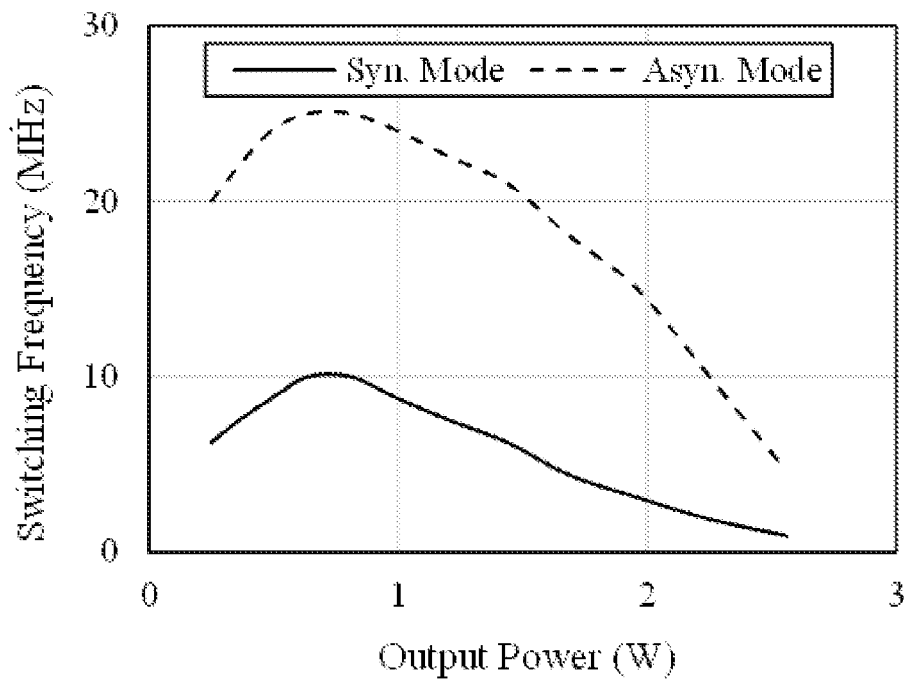
FIGS. 12A and 12B show plots of measurement results of the switching frequency and the static power-efficiency of the supply modulator respectively with asynchronous and synchronous mode.
Figure 12B:
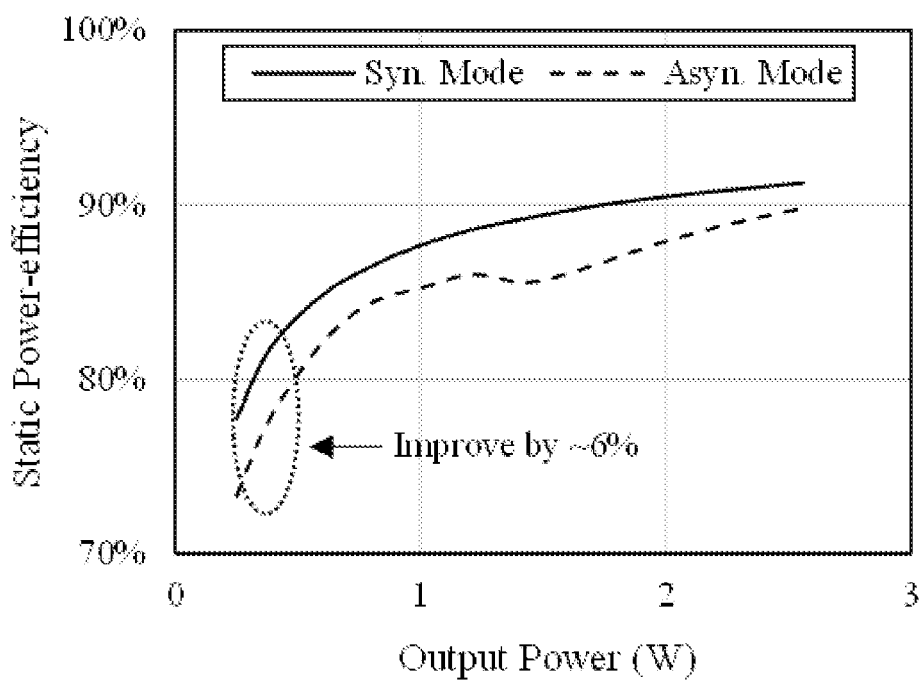

FIGS. 12A and 12B show plots of measurement results of the switching frequency and the static power-efficiency of the supply modulator of various embodiments respectively with asynchronous and synchronous mode, illustrating the average switching frequency and the static power-efficiency for narrowband (synchronous Sigma-Delta mode) and wideband (asynchronous Sigma-Delta mode) applications. It may be seen in FIG. 12A that the switching frequency for narrowband applications (synchronous mode) is 4× lower—translating to a worthy ~6% improvement in power-efficiency (see FIG. 12B). Further, for both narrowband and wideband applications, the switching frequency is at maximum at an output power of about 0.8 W (i.e., vDD_PA=1.8V), and reduces when the output power increases or reduces. This may be similar to the case of Sigma-Delta converters and Sigma-Delta Class D amplifiers whose switching frequency is maximal when the output is at half VDD (or AC ground).

Figure 13:
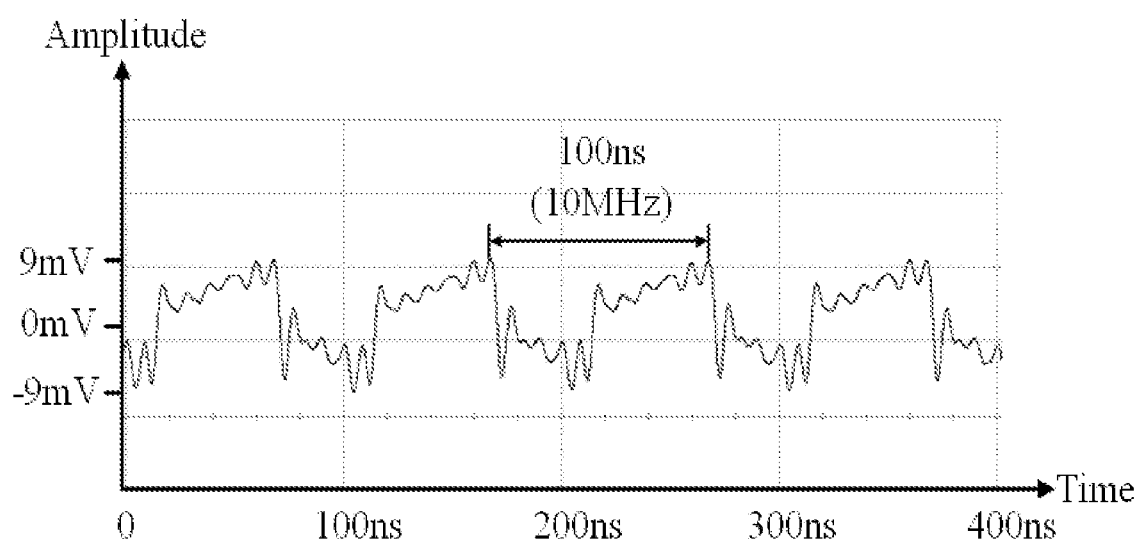
FIG. 13 shows a plot of the measured switching noise for $v_{DD\_PA}$=1.8V.

FIG. 13 shows a plot of the measured switching noise for $v_{DD\_PA}$=1.8V, illustrating the measured waveform of the ripple noise of the supply modulator at $v_{DD\_PA}$=1.8V with synchronous mode ($f_{CLK}$=20 MHz). The switching noise is ~18 $mV_{pp}$, which equals to ~5 $mV_{rms}$. The power-efficiency and switching noise are benchmarked against known supply modulators in Table 2 below.

Figure 14A:
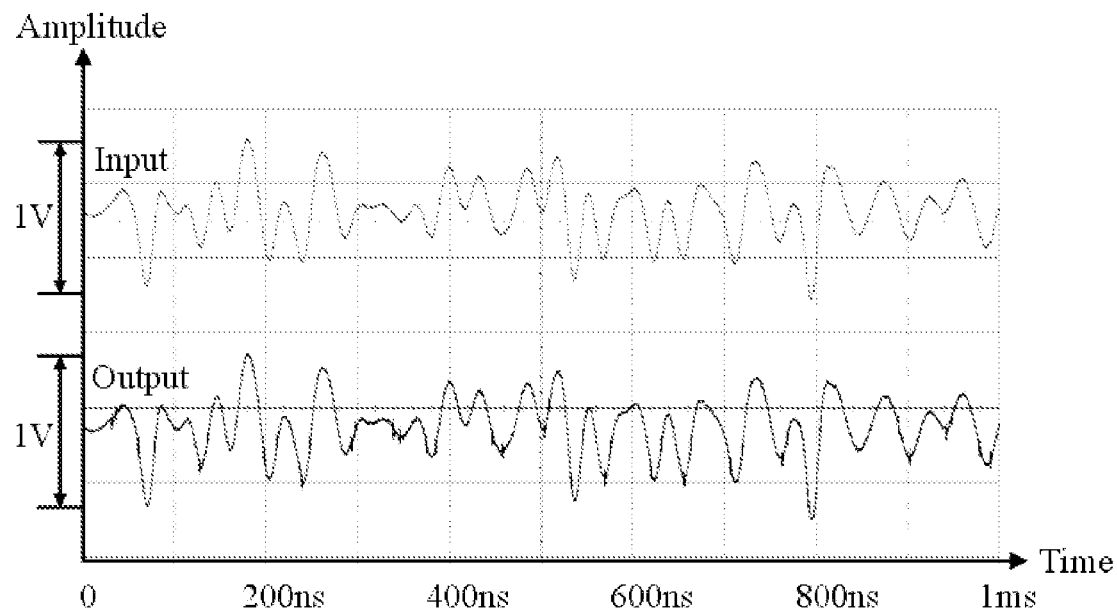
FIG. 14A show a plot of measurement results of the transient response of the supply modulator tracking a 40 MHz LTE envelope signal.
Figure 14B:
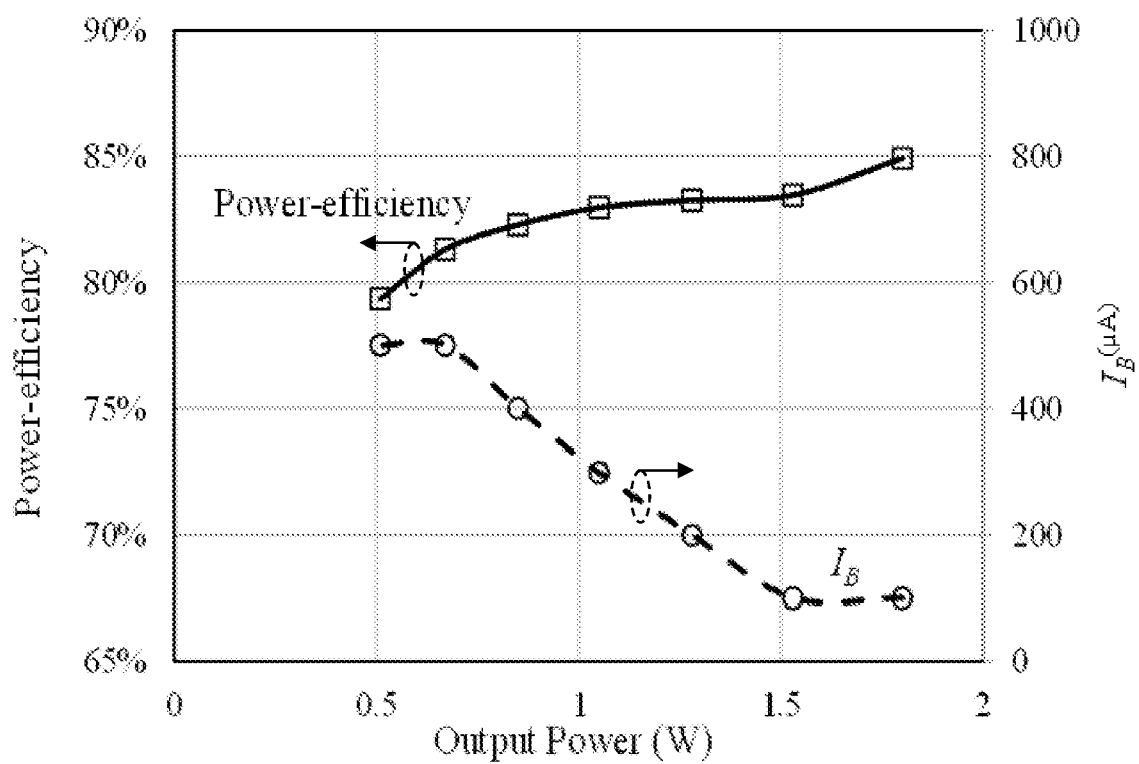
FIG. 14B show a plot of measurement results of the power-efficiency of the supply modulator tracking the 40 MHz LTE for various output powers.

FIGS. 14A and 14B illustrate the performance of the supply modulator of various embodiments for 40 MHz LTE envelope signals. FIG. 14A shows a plot of measurement results of the transient response of the supply modulator of various embodiments tracking a 40 MHz LTE envelope signal, illustrating the waveforms of the input signals, and the time domain response of the supply modulator tracking the extracted envelope signals from the 40 MHz LTE RF signals (~2.6$V_{rms}$ and ~1$V_{pp}$). As may be observed, the supply modulator is able to follow the envelope signals very closely. FIG. 14B shows a plot of measurement results of the power-efficiency of the supply modulator of various embodiments tracking the 40 MHz LTE for various output-power levels. The supply modulator is able to provide a maximum power of about 1.8 W with a maximum efficiency of approximately 85% (h is 100 μA for maximal quiescent current). By automatically adjusting the quiescent current of the Class AB amplifier according to the output power of the envelope signals (see FIGS. 8A and 8B), the power-efficiency remains >80% for a wide range of output power, from about 0.5 W to about 1.8 W.

Figure 14C:
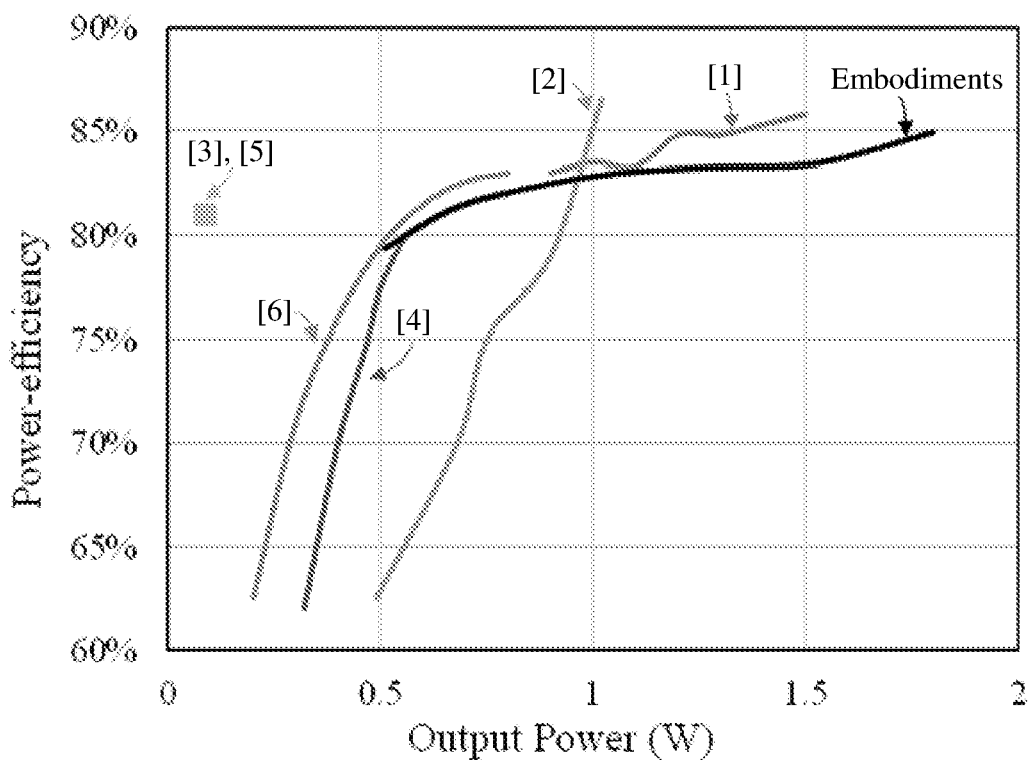
FIG. 14C shows a plot comparing the dynamic efficiency of the supply modulator with known designs.

FIG. 14C shows a plot comparing the dynamic efficiency of the supply modulator of various embodiments with known designs. In FIG. 14C, the numbers in brackets refer to the same references indicated in Table 2 below. As may be observed in FIG. 14C, the supply modulator of various embodiments improves the dynamic power-efficiency broadly and is capable of supplying a maximum output power of about 1.8 W.

To ascertain the overall performance of the ET PA embodying the supply modulator of various embodiments and a commercial RF PA, Band VIII 20 MHz LTE (100 RB, QPSK) RF signals and their extracted envelope signals are applied to the ET PA.

Figure 16:
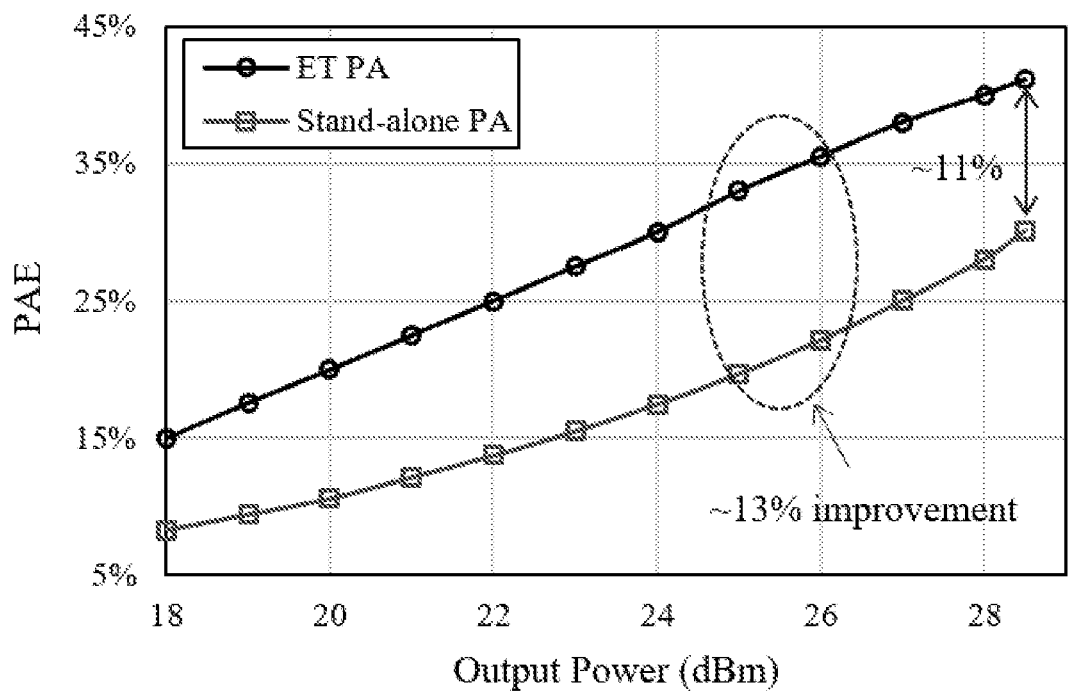
FIG. 16 shows the measured power added efficiency (PAE) of the ET PA and the stand-alone RF PA against the RF PA output power.
Figure 15:
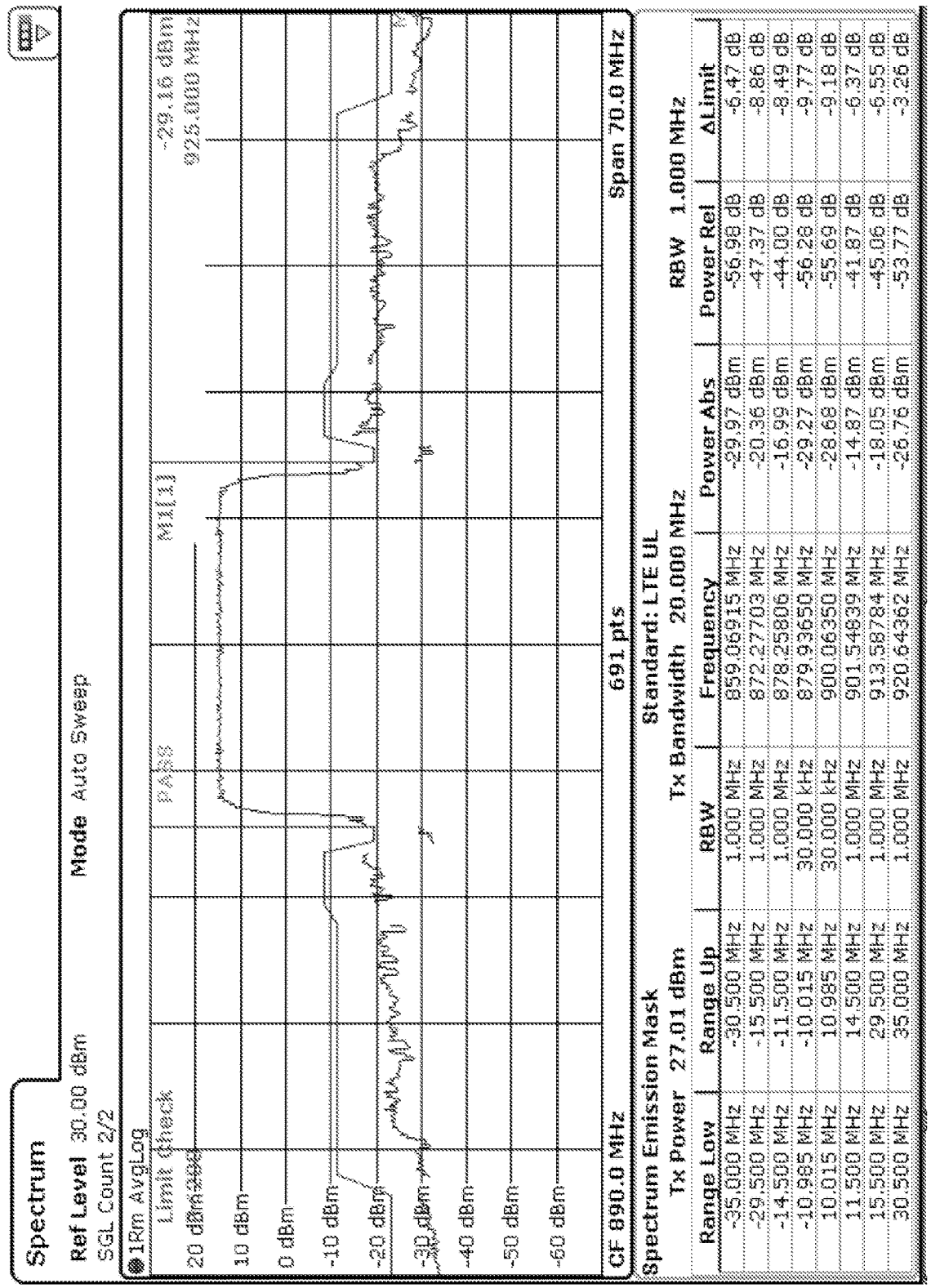
FIG. 15 shows the measured RF PA output spectrum for 20 MHz LTE signal at 27 dBm RF PA output power.

FIG. 15 shows the measured RF PA output spectrum for 20 MHz LTE signal at 27 dBm RF PA output power, which meets the spectrum mask of 20 MHz LTE signals. FIG. 16 shows the measured power added efficiency (PAE) of the ET PA of various embodiments and the stand-alone RF PA against the RF PA output power. The measured overall PAE of the ET PA is 41.1% @28.5 dBm—a significant 11% power-efficiency improvement compared to the stand-alone PA. The improved power-efficiency is even more significant around 3 dB backoff where the improvement is ~13%—a significant >1.6× improvement compared to the RF PA without supply modulator.

The measurements of the supply modulator of various embodiments are consolidated in Table 2 and are benchmarked against known designs. From Table 2, it may be seen that the supply modulator of various embodiments features the highest output power (2.5 W), highest static power-efficiency (91%) and highest bandwidth (40 MHz) of all benchmarked supply modulators. The supply modulator of various embodiments also features high dynamic power-efficiency (85%) and low switching noise (18 $mV_{pp}$). Further, the supply modulator of various embodiments also features high backoff power-efficiency as observed in FIG. 14C and Table 2. In summary, the performance of the supply modulator of various embodiments is highly competitive.

TABLE 2

Comparison of various embodiments against known supply modulators

| Design | Various embodiments | [1] | [2] | [3] | [4] | [5] | [6] |
|---|---|---|---|---|---|---|---|
| Control | Dual-mode Sigma-Delta | SAVT | SIDO | SCCI | Hysteresis with AC-coupling | Ripple-current-based PWM | Hysteresis with AC-coupling |
| Topology | Hybrid | Class D | Class D | Hybrid | Hybrid | Hybrid | Hybrid |
| Signal tracked | 40 MHz LTE-A | 10 MHz LTE | 10 MHz LTE | 10 MHz 0.8 $V_{pp}$ sine wave | 10 MHz LTE | 13 MHz 0.8 $V_{pp}$ sine wave | 40 MHz LTE-A |

TABLE 2-continued

Comparison of various embodiments against known supply modulators

| Design | Various embodiments | [1] | [2] | [3] | [4] | [5] | [6] |
|---|---|---|---|---|---|---|---|
| Max output power | 2.5 W | 2 W | 1 W | 0.2 W | 1 W | 0.2 W | 1 W |
| Max static power-efficiency | 91% | 87% | — | 88% | — | 88% | — |
| Max dynamic power-efficiency | 85% | 86% | 87% | 81% | 82% | 81% | 83% |
| 3 dB backoff power-efficiency | 82% | — | 64% | — | 70% | — | 76% |
| Switching noise | 18 $mV_{pp}$ | — | — | 8 $mV_{pp}$ | −137 dBm/Hz | 8 $mV_{pp}$ | −136 dBm/Hz |
| Supply voltage | 3.6 V | 3.3 V | 3.3 V | 1.2 V | 4 V | 1.2 V | 4 V |
| Process | 180 nm | 180 nm | 180 nm | 130 nm | 130 nm | 130 nm | 130 nm |

[1] J. Sankman, et. al., *IEEE Trans. on Power Electronics*, vol. 31, pp. 817-826, 2016.
[2] S. Sung et al., *IEEE Trans. on Power Electronics*, vol. 31, pp. 8282-8292, 2016.
[3] M. Tan, et. al., *IEEE J. of Solid-State Circuits*, vol. 51, no. 2, pp. 533-542, February 2016.
[4] J. S. Paek et al., *IEEE J. of Solid-State Circuits*, vol. 51, no. 11, pp. 2757-2768, November 2016.
[5] M. Tan, et. al., *IEEE J. of Solid-State Circuits*, vol. 52, no. 2, pp. 569-578, February 2017.
[6] J. S. Paek et al., *IEEE ISSCC Dig. Tech. Papers*, 2016, pp. 354-355.

As described above, various embodiments may provide a supply modulator with a dual-mode Sigma-Delta control for multi-standard applications. The supply modulator may embody a simple comparator without adding hysteresis for wideband applications, may regulate the switching frequency of the Class D amplifier for narrowband applications, and may self-adjust the quiescent current of the Class AB amplifier according to the characteristics of the envelope signals. As also described above, the power-efficiency of the supply modulator may be improved for a wide range of applications with different output-power levels. The supply modulator is a competitive design when benchmarked against known supply modulators.

The supply modulator of various embodiments is designed and monolithically realised in 180 nm CMOS process. On the basis of measurements on fabricated ICs, the static power-efficiency of the supply modulator features up to a significant 6% improvement and peak efficiency of ~91%. When benchmarked against known supply modulators, the supply modulator of various embodiments features the highest bandwidth (40 MHz), yet with high output power (2.5 W), high peak efficiency (91%), high output voltage swing (3V) and low output noise (18 $mV_{pp}$) at 3.6V supply. For tracking 40 MHz LTE-A envelope signals, the fabricated supply modulator achieves high power-efficiency of 85% at 1.8 W output power and remains >80% over a wide range of output power, from 0.5 W to 1.8 W. The ET PA having the fabricated supply modulator for tracking 20 MHz LTE envelope signals achieves a high power-efficiency of 41.4% at peak output power of 28.5 dBm and 34.4% at 3 dB backoff—a significant >1.6× improvement over the RF PA without the supply modulator.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A supply modulator comprising:
 a first amplifier circuit configured to generate a first electrical output signal for driving an electrical load;
 a control circuit electrically coupled to the first amplifier circuit; and
 a second amplifier circuit electrically coupled to the control circuit, the second amplifier circuit being configured to generate a second electrical output signal for driving the electrical load,
 wherein the control circuit is configured to generate a pulsed electrical signal based on the first electrical output signal, and further configured to supply, based on the pulsed electrical signal, an output control signal to the second amplifier circuit for controlling generation of the second electrical output signal,
 wherein, the supply modulator is configured,
 in a first mode of operation,
  for the first amplifier circuit to generate the first electrical output signal in response to a quiescent current of the first amplifier circuit being of a first magnitude that is fixed,
  for the control circuit to sample the pulsed electrical signal in accordance with a clock signal received by the control circuit to generate a modulated electrical signal as the output control signal, and
  for the second amplifier circuit, for generating the second electrical output signal, to operate at a first frequency in accordance with a temporal-related parameter of the modulated electrical signal, and
 in a second mode of operation,
  for the first amplifier circuit to generate the first electrical output signal in response to the quiescent current being of a second magnitude that is variable,
  for the control circuit to provide the pulsed electrical signal as the output control signal, and
  for the second amplifier circuit, for generating the second electrical output signal, to operate at a second frequency in accordance with a temporal-related parameter of the pulsed electrical signal.

2. The supply modulator as claimed in claim 1, further comprising:
 a current controller circuit,
 wherein, in the second mode of operation,
 the current controller circuit is configured to:
  receive an input signal,
  compare a magnitude of the input signal against a plurality of reference magnitude levels, and adjust a magnitude of at least one bias current for the first amplifier circuit in accordance with results of the comparison against the plurality of reference magnitude levels; and the supply modulator is configured for the first amplifier circuit to generate the first electrical output signal in response to the quiescent current and the at least one bias current.

3. The supply modulator as claimed in claim 2, wherein the current controller circuit comprises:
a plurality of comparators; and
a plurality of switches, wherein each switch of the plurality of switches is associated with a respective comparator of the plurality of comparators,
wherein, for adjusting the magnitude of the at least one bias current, for each comparator of the plurality of comparators,
the comparator is configured to compare the magnitude of the input signal against a respective reference magnitude level of the plurality of reference magnitude levels, and
the switch associated with the comparator is configured to be in one of two states in accordance with result of the comparison corresponding to the comparator.

4. The supply modulator as claimed in claim 2, wherein the first amplifier circuit comprises:
a first circuit, a second circuit, and a third circuit electrically coupled to each other,
wherein the first circuit is configured to receive the input signal, and further configured to provide gain to the input signal for generating the first electrical output signal, and
wherein the second circuit is configured to provide, based on the at least one bias current, one or more biasing voltages to the third circuit to control the third circuit for generating the first electrical output signal.

5. The supply modulator as claimed in claim 1, wherein the control circuit comprises a comparator configured to generate the pulsed electrical signal based on the first electrical output signal.

6. The supply modulator as claimed in claim 1, wherein the control circuit comprises a sampling circuit, wherein the supply modulator is configured,
in the first mode of operation, for the sampling circuit to sample the pulsed electrical signal in accordance with the clock signal to generate the modulated electrical signal as the output control signal, and
in the second mode of operation, for the sampling circuit to pass through the pulsed electrical signal as the output control signal.

7. The supply modulator as claimed in claim 1, wherein the control circuit comprises:
a sensing circuit,
wherein the sensing circuit is configured, for generating the pulsed electrical signal, to generate a sensing electrical signal based on the first electrical output signal, the sensing electrical signal having a magnitude that is scaled by a defined factor relative to a magnitude of the first electrical output signal.

8. The supply modulator as claimed in claim 1, wherein the second amplifier circuit comprises:
a pair of transistors coupled to each other, wherein the pair of transistors is configured for generating the second electrical output signal.

9. The supply modulator as claimed in claim 8, wherein the second amplifier circuit further comprises:
a sub-circuit electrically coupled to the pair of transistors, wherein the sub-circuit is configured to introduce propagating delay to the output control signal supplied by the control circuit to generate respective electrical signals to the pair of transistors for generating the second electrical output signal, the respective electrical signals being at least substantially non-overlapping temporally.

10. The supply modulator as claimed in claim 1, further comprising:
an inductor to reduce a switching noise of the second amplifier circuit.

11. A power amplifier comprising:
the supply modulator as claimed in claim 1; and
an electrical load electrically coupled to the supply modulator,
wherein the supply modulator is configured to receive an input signal, and further configured to track an envelope of the input signal for generating the first electrical output signal and the second electrical output signal for driving the electrical load.

12. A method for controlling a supply modulator comprising:
generating, by means of a first amplifier circuit of the supply modulator, a first electrical output signal for driving an electrical load;
generating, by means of a control circuit of the supply modulator, a pulsed electrical signal based on the first electrical output signal;
generating, by means of a second amplifier circuit of the supply modulator, a second electrical output signal for driving the electrical load; and
supplying, based on the pulsed electrical signal and by means of the control circuit, an output control signal for controlling generation of the second electrical output signal,
wherein, in a first mode of operation, the method comprises:
generating the first electrical output signal in response to a quiescent current of the first amplifier circuit being of a first magnitude that is fixed;
sampling, by means of the control circuit, the pulsed electrical signal in accordance with a clock signal to generate a modulated electrical signal as the output control signal; and
operating the second amplifier circuit at a first frequency in accordance with a temporal-related parameter of the modulated electrical signal for generating the second electrical output signal;
wherein, in a second mode of operation, the method comprises:
generating the first electrical output signal in response to the quiescent current being of a second magnitude that is variable;
providing, by means of the control circuit, the pulsed electrical signal as the output control signal; and
operating the second amplifier circuit at a second frequency in accordance with a temporal-related parameter of the pulsed electrical signal for generating the second electrical output signal.

13. The method as claimed in claim 12,
wherein, in the second mode of operation, the method comprises:
receiving an input signal;
comparing a magnitude of the input signal against a plurality of reference magnitude levels; and
adjusting a magnitude of at least one bias current for the first amplifier circuit in accordance with results of the comparison against the plurality of reference magnitude levels, wherein generating the first electrical output signal comprises generating the first electrical output signal in response to the quiescent current and the at least one bias current.

14. The method as claimed in claim 12,
wherein generating the pulsed electrical signal comprises generating a sensing electrical signal based on the first electrical output signal for generating the pulsed electrical signal, the sensing electrical signal having a magnitude that is scaled by a defined factor relative to a magnitude of the first electrical output signal.

15. The method as claimed in claim 12, further comprising:
introducing, by means of the second amplifier circuit, propagating delay to the output control signal to generate respective electrical signals to a pair of transistors of the second amplifier circuit for generating the second electrical output signal, the pair of transistors being coupled to each other and the respective electrical signals being at least substantially non-overlapping temporally.

16. The method as claimed in claim 12, further comprising:
controlling a slew rate of the second amplifier circuit for determining a transition frequency for the supply modulator to transition between the first mode of operation and the second mode of operation.

17. The method as claimed in claim 12, further comprising:
reducing, by means of an inductor, a switching noise of the second amplifier circuit.

18. A method for controlling a power amplifier comprising:
receiving, by means of a supply modulator of the power amplifier, an input signal, wherein the supply modulator is as claimed in claim 1; and
tracking an envelope of the input signal for generating the first electrical output signal and the second electrical output signal for driving an electrical load of the power amplifier.

19. The supply modulator as claimed in claim 3, wherein the first amplifier circuit comprises:
a first circuit, a second circuit, and a third circuit electrically coupled to each other,
wherein the first circuit is configured to receive the input signal, and further configured to provide gain to the input signal for generating the first electrical output signal, and
wherein the second circuit is configured to provide, based on the at least one bias current, one or more biasing voltages to the third circuit to control the third circuit for generating the first electrical output signal.

20. The method as claimed in claim 13,
wherein generating the pulsed electrical signal comprises generating a sensing electrical signal based on the first electrical output signal for generating the pulsed electrical signal, the sensing electrical signal having a magnitude that is scaled by a defined factor relative to a magnitude of the first electrical output signal.

* * * * *